United States Patent
Cheng et al.

(10) Patent No.: US 12,334,431 B2
(45) Date of Patent: Jun. 17, 2025

(54) SEMICONDUCTOR INTERCONNECTION STRUCTURES AND METHODS OF FORMING THE SAME

(71) Applicant: TAIWAN SEMICONDUCTOR MANUFACTURING COMPANY, LTD., Hsinchu (TW)

(72) Inventors: Kai-Fang Cheng, Taoyuan (TW); Hsiao-Kang Chang, Taoyuan (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 598 days.

(21) Appl. No.: 17/577,182

(22) Filed: Jan. 17, 2022

(65) Prior Publication Data
US 2022/0415786 A1 Dec. 29, 2022

Related U.S. Application Data

(60) Provisional application No. 63/214,898, filed on Jun. 25, 2021.

(51) Int. Cl.
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/7682* (2013.01); *H01L 21/76831* (2013.01); *H01L 21/76879* (2013.01); *H01L 23/53238* (2013.01); *H01L 23/53295* (2013.01)

(58) Field of Classification Search
CPC .......... H01L 21/7682; H01L 21/76831; H01L 21/76879; H01L 21/76852; H01L 21/76885; H01L 23/5226; H01L 23/53238; H01L 23/53295; H01L 23/5329
See application file for complete search history.

(56) References Cited

U.S. PATENT DOCUMENTS

| | | | |
|---|---|---|---|
| 5,641,712 A * | 6/1997 | Grivna | H01L 23/5222 438/626 |
| 9,105,490 B2 | 8/2015 | Wang et al. | |
| 9,236,267 B2 | 1/2016 | De et al. | |
| 9,236,300 B2 | 1/2016 | Liaw | |
| 9,305,836 B1 * | 4/2016 | Gates | H01L 21/76864 |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,199,325 B2 * | 2/2019 | Yim | H01L 21/76897 |

(Continued)

*Primary Examiner* — Zandra V Smith
*Assistant Examiner* — John M Parker
(74) *Attorney, Agent, or Firm* — NZ Carr Law Office

(57) ABSTRACT

A first dielectric layer is formed on a semiconductor structure. The first dielectric layer has a hardness higher than 10 GPa and a dielectric constant in a range between 1.0 and 4.0. A trench is formed in the first dielectric layer. A conductive feature is formed in the trench in contact with the semiconductor structure. A second dielectric layer is formed over the first dielectric layer and the conductive feature. A via structure is formed in the second dielectric layer in contact with the conductive feature.

19 Claims, 24 Drawing Sheets

(56) References Cited

U.S. PATENT DOCUMENTS

| | | | |
|---|---|---|---|
| 11,804,403 B2* | 10/2023 | Huang | H01L 23/5283 |
| 2005/0208684 A1* | 9/2005 | Yamada | H01L 24/05 |
| | | | 257/E21.525 |
| 2007/0205507 A1* | 9/2007 | Chang | H01L 23/5329 |
| | | | 257/734 |
| 2010/0093168 A1* | 4/2010 | Naik | H01L 21/76834 |
| | | | 438/618 |
| 2016/0079056 A1* | 3/2016 | Harada | H01J 37/32449 |
| | | | 118/725 |
| 2018/0122938 A1* | 5/2018 | Cheng | H01L 29/7827 |
| 2020/0212192 A1* | 7/2020 | Xie | H01L 23/535 |

* cited by examiner

SEMICONDUCTOR INTERCONNECTION STRUCTURES AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

However, as the spacing between components is reduced, the damages of interlayer dielectric (ILD) layers formed in the etch process may affect the dielectric constant and cause some reliability fail. Therefore, there is a need in the art to provide improved devices or methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
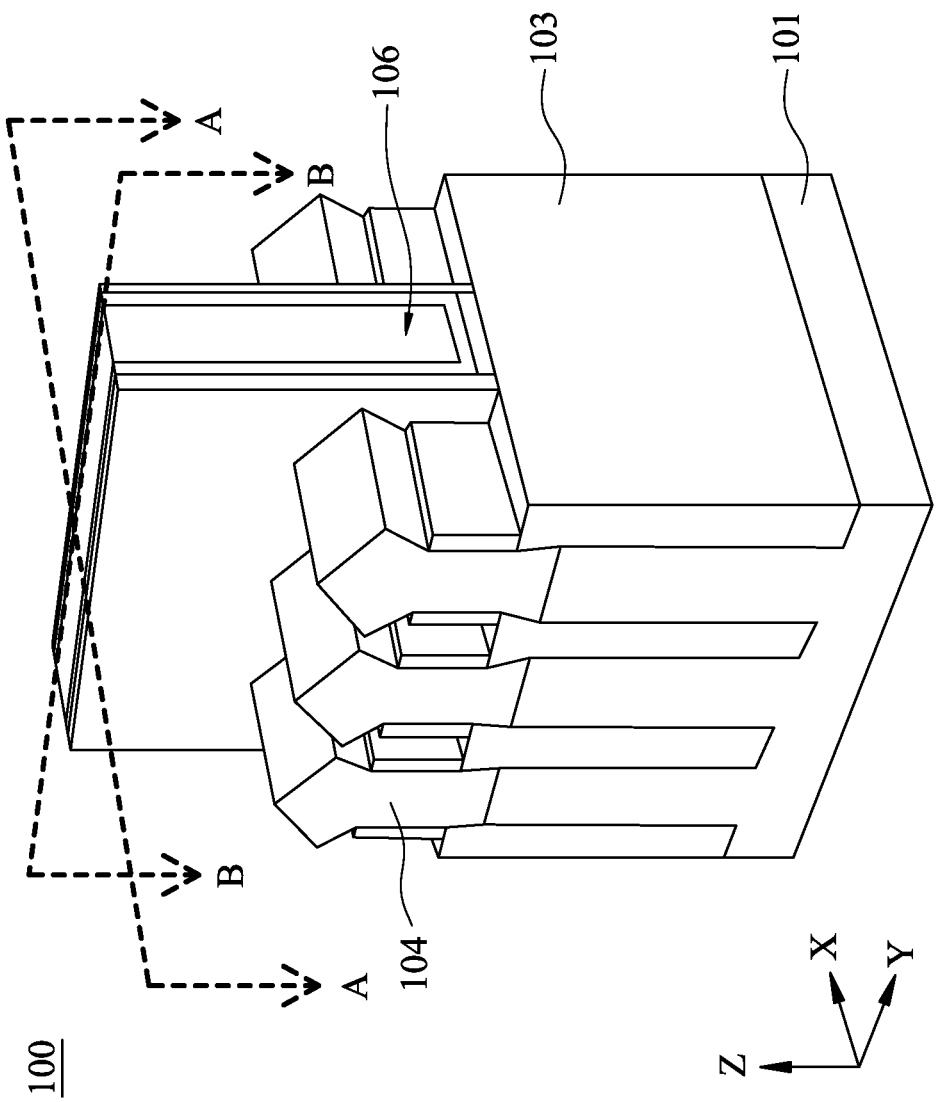
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective view of one of the various stages of manufacturing a semiconductor device structure 100, in accordance with some embodiments. As shown in FIG. 1, the semiconductor device structure 100 includes a substrate 101 having at least a plurality of devices formed thereover. The devices, such as transistors, diodes, imaging sensors, resistors, capacitors, inductors, memory cells, a combination thereof, and/or other suitable devices, may be formed on the substrate 101. In some embodiments, the interconnection structures may be formed on or below the devices.

Figure 2:
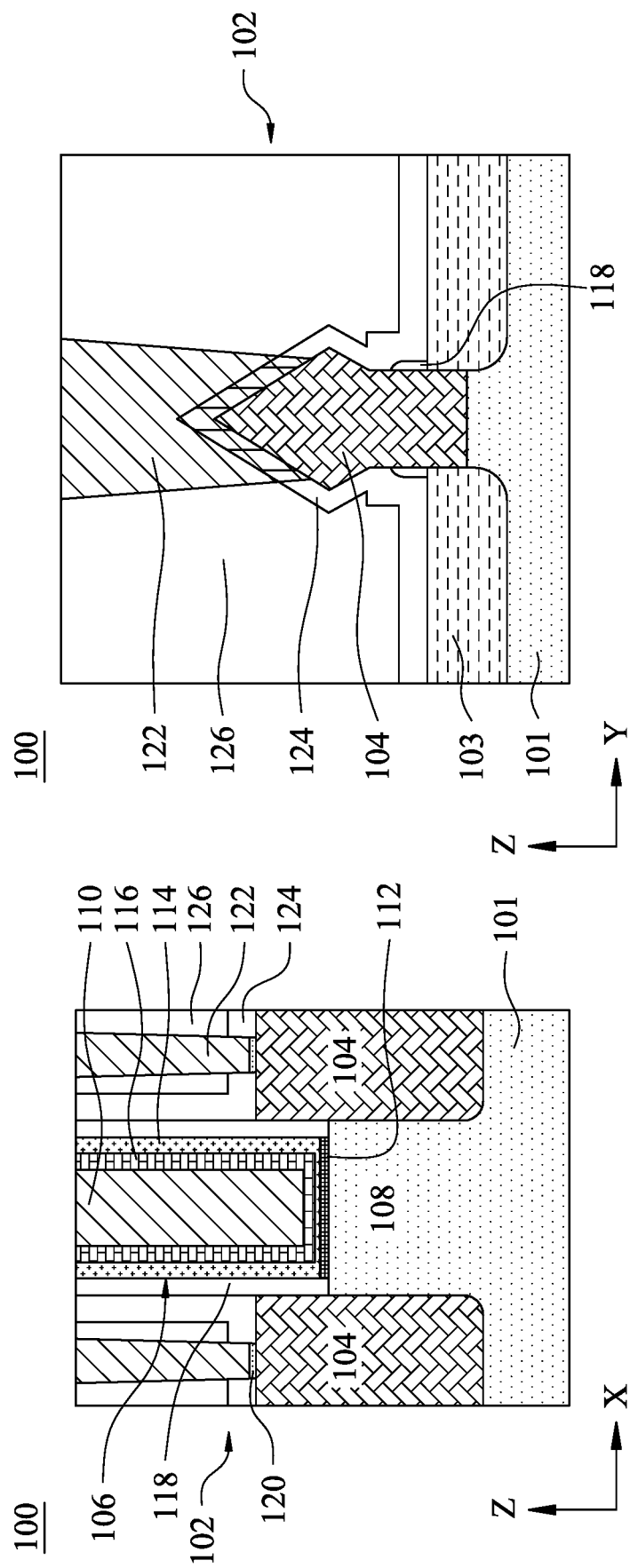
FIGS. 2A-2B are cross-sectional side views of one of various stages of manufacturing a semiconductor device structure, in accordance with some embodiments.

FIGS. 2A-2B are cross-sectional side views of various stages of manufacturing the semiconductor device structure 100, in accordance with some embodiments. FIG. 2A is a cross-sectional side view of the semiconductor device structure 100 taken along the line A-A of FIG. 1, and FIG. 2B is a cross-sectional side view of the semiconductor device structure 100 taken along the line B-B of FIG. 1. The line A-A of FIG. 1 extends along a direction that is substantially perpendicular to the longitudinal direction of a gate stack 106, and the line B-B of FIG. 1 extends along the longitudinal direction of the gate stack 106. As shown in FIGS. 2A and 2B, the semiconductor device structure 100 includes the substrate 101, one or more devices 102 formed on the substrate 101. The interconnection structures may be formed over the devices 102.

The substrate 101 may be a semiconductor substrate. In some embodiments, the substrate 101 includes a crystalline semiconductor layer on at least the surface of the substrate 101. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). In some embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxygen-containing material, such as an oxide.

The substrate 101 may include various regions that have been suitably doped with impurities (e.g., p-type or n-type impurities). The dopants are, for example phosphorus for an n-type fin field effect transistor (FinFET) and boron for a p-type FinFET.

As described above, the devices 102 may be any suitable devices, such as transistors, diodes, imaging sensors, resistors, capacitors, inductors, memory cells, or a combination thereof. In some embodiments, the devices 102 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 102 formed between the substrate 101 and the interconnection structures (such as the semiconductor device structure 200 shown in FIGS. 3-8) may be a FinFET or a nanostructure, which is shown in FIGS. 2A and 2B. An exemplary device 102 may include source/drain (S/D) regions 104 and a gate stack 106 disposed between the S/D regions 104 serving as source regions and the S/D regions 104 serving as drain regions. While there is only one gate stack 106 formed on the substrate 101, it is contemplated that two or more gate stacks 106 may also be formed on the substrate 101. The channel regions 108 are formed between the S/D regions 104 serving as source regions and the S/D regions 104 serving as drain regions.

The S/D regions 104 may include a semiconductor material, such as Si or Ge, a III-V compound semiconductor, an II-VI compound semiconductor, or other suitable semiconductor material. The exemplary S/D region 104 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 104 may include p-type dopants, such as boron; n-type dopants, such as phosphorus or arsenic; and/or other suitable dopants including combinations thereof. The S/D regions 104 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 101. In some embodiments, the devices 102 are FinFETs, and the channel regions 108 are a plurality of fins each having at least three surfaces wrapped around by the gate stack 106. In some other embodiments, the devices 102 are nanosheet transistors, and the channel regions 108 are surrounded by the gate stack 106.

Each gate stack 106 includes a gate electrode layer 110 disposed over the channel region 108 or partially/fully surrounding the channel region 108. The gate electrode layer 110 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 106 may include an interfacial dielectric layer 112, a gate dielectric layer 114 disposed on the interfacial dielectric layer 112, and one or more conformal layers 116 disposed on the gate dielectric layer 114. The gate electrode layer 110 may be disposed on the conformal layers 116. The interfacial dielectric layer 112 may include a dielectric material, such as an oxygen-containing material or a nitrogen-containing material, or multilayers thereof, and may be formed by any suitable deposition method, such as CVD, PECVD, or ALD. The gate dielectric layer 114 may include a dielectric material such as an oxygen-containing material or a nitrogen-containing material, a high-k dielectric material having a k value greater than that of silicon dioxide, or multilayers thereof. The gate dielectric layer 114 may be formed by any suitable method, such as CVD, PECVD, or ALD. The conformal layers 116 may include one or more barrier layers and/or capping layers, such as a nitrogen-containing material, for example tantalum nitride (TaN), titanium nitride (TiN), or the like. The conformal layers 116 may further include one or more work-function layers, such as aluminum titanium carbide, aluminum titanium oxide, aluminum titanium nitride, or the like. The term "conformal" may be used herein for ease of description upon a layer having substantial same thickness over various regions. The conformal layers 116 may be deposited by ALD, PECVD, MBD, or any suitable deposition technique.

One or more gate spacers 118 are formed along sidewalls of the gate stack 106 (e.g., sidewalls of the gate dielectric layers 114). The gate spacers 118 may include silicon oxycarbide, silicon nitride, silicon oxynitride, silicon carbon nitride, the like, multi-layers thereof, or a combination thereof, and may be deposited by CVD, PVD, ALD, or other suitable deposition technique.

Portions of the gate stacks 106 and the gate spacers 118 may be formed on the isolation regions 103. The isolation regions 103 are formed on the substrate 101. The isolation regions 103 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 103 includes silicon oxide that is formed by a FCVD process.

A contact etch stop layer (CESL) 124 is formed on a portion of the S/D regions 104 and the isolation region 103, and a first interlayer dielectric (ILD) 126 is formed on the CESL 124. The CESL 124 can provide a mechanism to stop an etch process when forming openings in the first ILD 126. The CESL 124 may be conformally deposited on surfaces of the S/D regions 104 and the isolation regions 103. The CESL 124 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, PVD, ALD, or any suitable deposition technique. The first ILD 126 may include an oxide formed by tetraethylorthosilicate (TEOS), un-doped silicate glass, or doped silicon oxide such as boro-phosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 120 is formed on at least a portion of each S/D region 104, as shown in Figure. The silicide layer 120 may include a material having one or more of WSi, CoSi, NiSi, TiSi, MoSi and TaSi. In some embodiments, the silicide layer 120 includes a metal or metal alloy silicide, and the metal includes a noble metal, a refractory metal, a rare earth metal, alloys thereof, or combinations thereof. A conductive contact 122 is disposed on each silicide layer 120. The conductive contact 122 may include a material having one or more of Ru, Mo, Co, Ni. W, Ti, Ta, Cu, Al, TiN or TaN, and the conductive contact 122 may be formed by any suitable method, such as electro-chemical plating (ECP), or PVD. The silicide layer 120 and the conductive contact 122 may be formed by first forming an opening in the first ILD 126 and the CESL 124 to expose at least a portion of the S/D region 104, then forming the silicide layer 120 on the exposed portion of the S/D region 104, and then forming the conductive contact 122 on the silicide layer 120.

Figure 23:
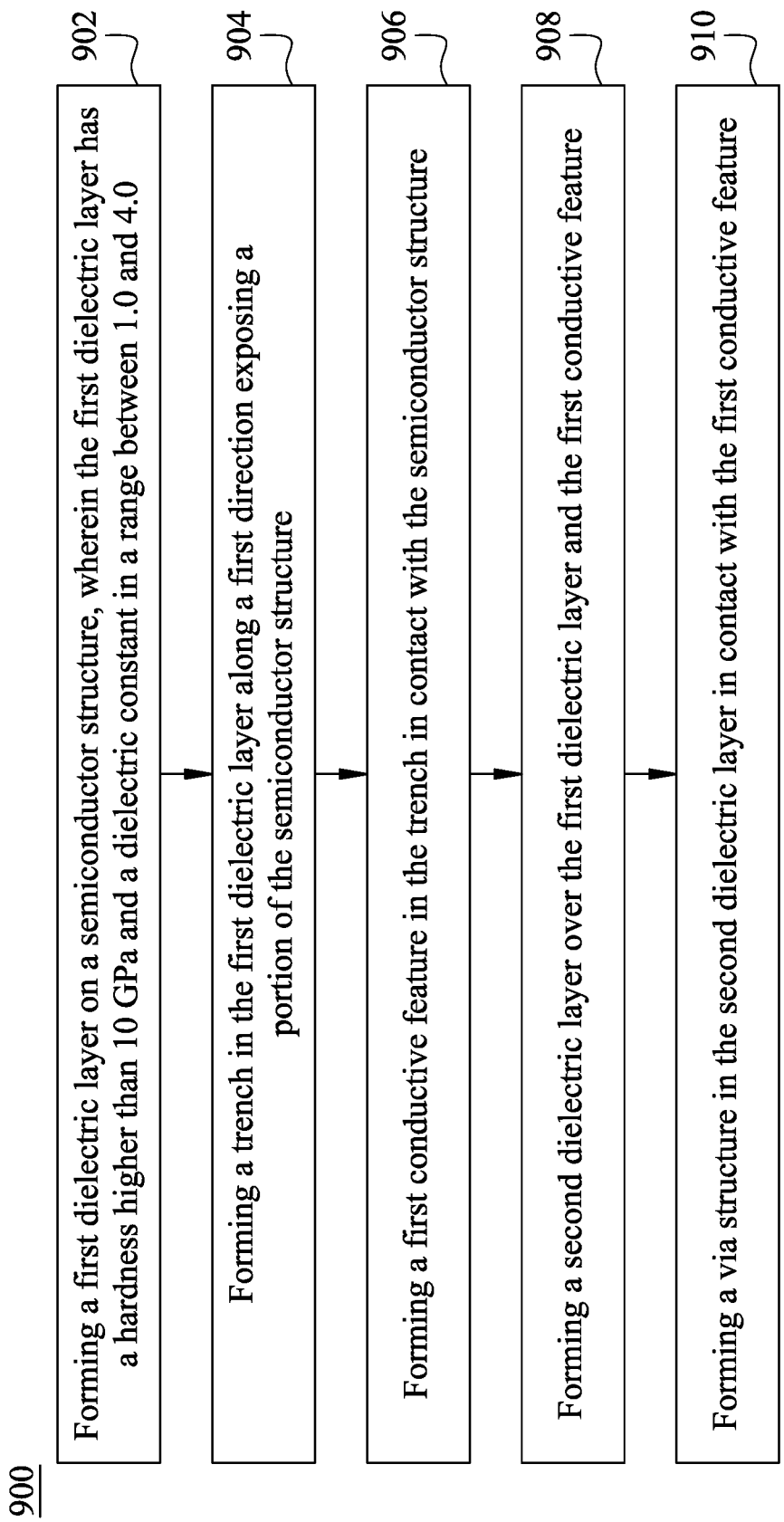
FIG. 23 is a flow chart of a method for manufacturing a semiconductor interconnection structure in accordance with some embodiments.

FIGS. 3-8 are cross-sectional side views of various stages of manufacturing a semiconductor device structure 200, including an interconnection structure 202, in accordance with some embodiments. FIG. 23 is a flow chart of a method 900 for manufacturing the interconnection structure 202 in accordance with some embodiments. For the purpose of better describing the present disclosure, the cross-sectional side views of the semiconductor device structure 200 in FIGS. 3-8 and the method 900 in FIG. 23 will be discussed together. It is understood that the operations shown in the method 900 are not exhaustive and that other operations may be performed as well before, after, or between any of the illustrated operations. Further, some of the operations may be performed simultaneously, or in a different order than shown in FIGS. 3-8 and FIG. 23.

Figure 3:
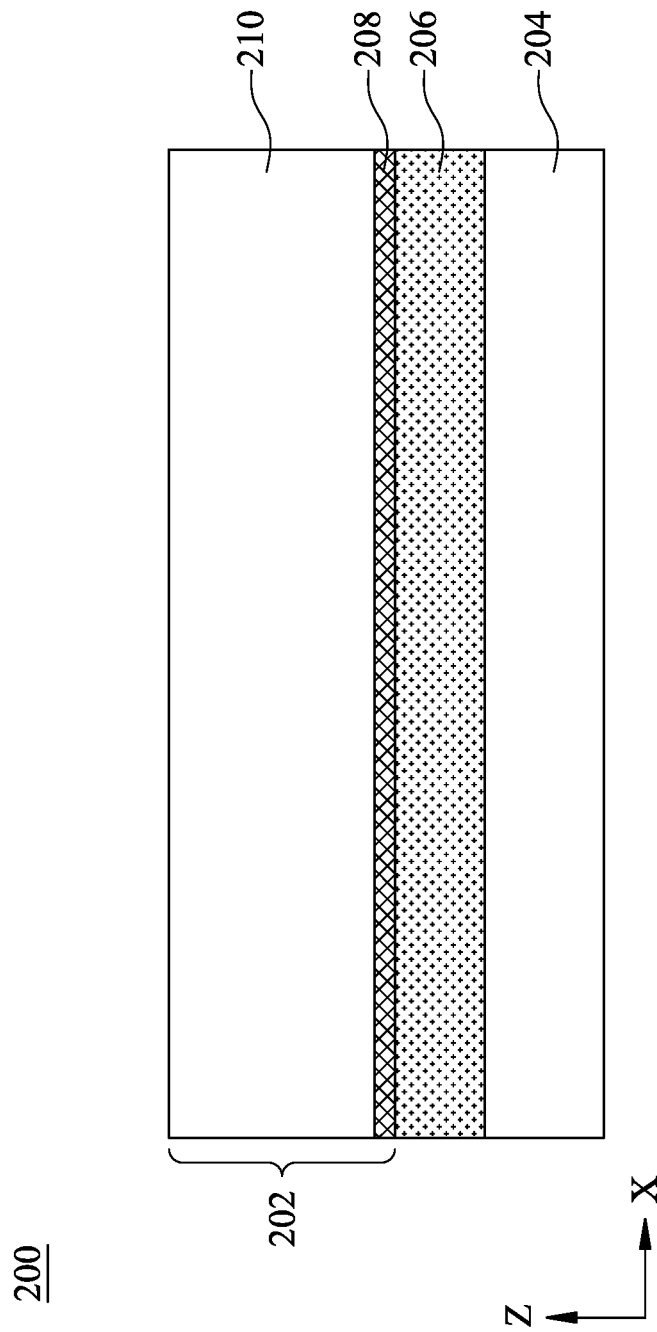
FIGS. 3-8 are cross-sectional side views of various stages of manufacturing a semiconductor device structure, in accordance with some embodiments.

As shown in FIG. 3, a semiconductor substrate 204 is provided. The semiconductor substrate 204 may be similar to the substrate 101 discussed above. A device layer 206 including a middle end of the line (MEOL) structure may be formed on the semiconductor substrate 204. In some embodiments, the device layer 206 may be the devices 102 shown in FIGS. 2A and 2B.

In the MEOL structure, low level interconnects (contacts), such as the conductive contacts 122 shown in FIGS. 2A and 2B, are formed over the S/D regions 104 and the gate electrode layer 110. The MEOL structure may have smaller critical dimensions and may be spaced closer together compared to the later formed BEOL counterparts. A purpose of the contact layers of the MEOL structure is to electrically connect the various regions of the transistors, i.e., the source/drain and metal gate electrode, to higher level interconnects in the BEOL.

As shown in FIG. 3 and the operation 902 in FIG. 23, a first dielectric layer 210 is formed over the device layer 206. In some embodiments, one or more etch stop layers (ESL) 208 may be formed under the first dielectric layer 210. The ESL 208 may be used to control the etching depth in the first dielectric layer 210 when forming the conductive feature in the first dielectric layer 210 in a later process. In some embodiments, the ESL 208 may include SiOx, SiCx, SiNx, SiCxNy, SiOxNy, AlNx, AlOx, AOxNy, SiOxCy, SiOxCyHz, or other suitable materials. In some embodiments, the ESL 208 may be formed in a temperature lower than 425 degrees Celsius by CVD, PVD, ALD, spin coating, or other suitable processes. In some embodiments, the ESL 208 may be formed in a temperature between 150 degrees Celsius and 420 degrees Celsius by CVD, PVD, ALD, spin coating, or other suitable processes. In some embodiments, the ESL 208 and the first dielectric layer 210 may be made of different materials.

In some embodiments, the first dielectric layer 210 may be a silicon carbo-nitride (SiCN) based material having a hardness higher than 10 GPa and a dielectric constant in a range between 1.0 and 4.0. The SiCN based material may be formed by using any suitable silicon-containing precursor, carbon-containing precursor, and nitrogen-containing precursor. Suitable gases for the silicon-containing precursor may include silane ($SiH_4$), dimethylsilane (($CH_3)_2SiH_2$), methylsilane ($SiH(CH_3)_3$), dichlorosilane ($SiH_2Cl_2$, DCS), trichlorosilane ($SiHCl_3$, TCS), or any suitable gases comprising Si, N, H, and optionally C in its molecule. Suitable gases for the nitrogen-containing precursor may include, but are not limited to, nitrogen ($N_2$), ammonia ($NH_3$), hydrazine ($N_2H_4$), or the like, or combinations thereof. Suitable carbon-containing precursor may include hydrocarbons such as acetylene ($C_2H_2$), ethylene ($C_2H_4$), ethane ($C_2H_6$), etc. In some embodiments, the first dielectric layer 210 may be formed from $Si(CH_3)_4$ with $NH_3$. In some embodiments, the first dielectric layer 210 may be formed from silane ($SiH_4$) with $NH_3$ and $C_2H_4$. The first dielectric layer 210 may be formed with or without post anneal or ultraviolet (UV) process. In some embodiments, the first dielectric layer 210 may be formed at a deposition temperature lower than 425 degrees Celsius by CVD, ALD, or other suitable processes. In some embodiments, the first dielectric layer 210 may be formed at a deposition temperature between 150 degrees Celsius and 420 degrees Celsius by CVD, ALD, or other suitable processes.

In some embodiments, the silicon-containing precursor, such as $Si(CH3)4$ or $SiH_4$, may have the silicon atom (or atoms) bonded to some combination of alkyl groups, amine groups, halogen atoms, and hydrogen atoms. A silicon compound having its silicon atom(s) bonded to one or more alkyl groups and/or hydrogen atoms is referred to as a silane. Depending on the embodiments, the silicon atom(s) may be bonded to 4 alkyl groups, or 3 alkyl groups and a hydrogen, or 2 alkyl groups and 2 hydrogens, or 1 alkyl group and 3 hydrogens, or just to 4 hydrogens. Possible alkyl groups which may be selected include, but are not limited to, the Me (i.e., $CH_3$), Et (i.e., $CH_2CH_3$), i-Pr (i.e., $CH(CH_3)_2$), n-Pr (i.e., $CH_2CH_2CH_3$), and t-butyl (i.e., $C(CH_3)_3$) functional groups. In some embodiments, $NH_3$ plasma processing may be applied in the ALD operation to treat the films intermittently between groups of ALD cycles at a process temperature lower than 425 degrees Celsius.

In some embodiments, the first dielectric layer 210 may be a boron carbo-nitride (BCN) based material having a hardness higher than 10 GPa and a dielectric constant in a range between 1.0 and 4.0. In some embodiments, the first dielectric layer 210 may be a BCN based material having a hardness higher than 10 GPa and a dielectric constant in a range between 1.0 and 3.0. In some embodiments, the first dielectric layer 210 may be formed from triethyl borate (TEB) with $NH_3$. In some embodiments, the first dielectric layer 210 may be formed at a deposition temperature lower than 425 degrees Celsius by CVD, ALD, or other suitable processes. In some embodiments, the first dielectric layer 210 may be formed at a deposition temperature between 150 degrees Celsius and 420 degrees Celsius by CVD, ALD, or other suitable processes.

In some embodiments, the BCN layer may be formed by performing a predetermined number of deposition cycles including sequentially supplying triethyl borate (TEB), boron trichloride ($BCl_3$), or diborane ($B_2H_6$) gas as a boron source, ammonia ($NH_3$) gas as a nitrogen source, and ethylene ($C_2H_4$) gas or propylene ($C_3H_6$) gas as a carbon source. In some embodiments, after the formation of the BCN layer, an addition anneal or UV curing process may be applied. In some embodiments, after the formation of the BCN layer, an addition anneal or UV curing process may not be required.

In some embodiments, the first dielectric layer 210 may be a silicon oxide carbide (SiOC) based material with ordered structure having a hardness higher than 10 GPa and a dielectric constant in a range between 1.0 and 4.0. In some embodiments, the first dielectric layer 210 may be a SiOC based material with ordered structure having a hardness higher than 10 GPa and a dielectric constant in a range between 1.0 and 3.0. The term "ordered" used herein refers to a predefined arrangement formed in a dielectric material.

In some embodiments, the first dielectric layer 210 may be formed from tetraethyl orthosilicate (TEOS) in an acidic ethanol with a surfactant, such as KCl. In some embodiments, the first dielectric layer 210 may be formed by a spin-on coating process. In some embodiments, after the formation of the SiOC layer, the anneal or UV curing process may be required to remove the surfactant. In some embodiments, an organosilicon precursor, such as TEOS or polydimethylsiloxane (PDMS), and a solvent, such as acidic ethanol are provided. In order to control the electrical conductivity of the solution containing the organosilicon precursor, an ionic salt, such as KCl or NaCl, may be added.

Various embodiments of the first dielectric layer 210 formed with a hardness higher than 10 GPa and a dielectric constant (k-value) in a range between 1.0 and 4.0 is advantageous because the high mechanical strength of the first dielectric layer 210 can prevent the first dielectric layer 210 from various etch damages in a later etch process. The low k-value of the first dielectric layer 210 can decrease RC delay and reduce cross-talk between nearby interconnects, thereby improving the reliability and performance of the semiconductor device structure 200. Furthermore, because the thermal dissipation characteristic is proportional to the root of the mechanical strength, with a high mechanical strength, the first dielectric layer 210 will also have a high thermal dissipation characteristic and improve the performance of the high-power devices as well.

Figure 4:
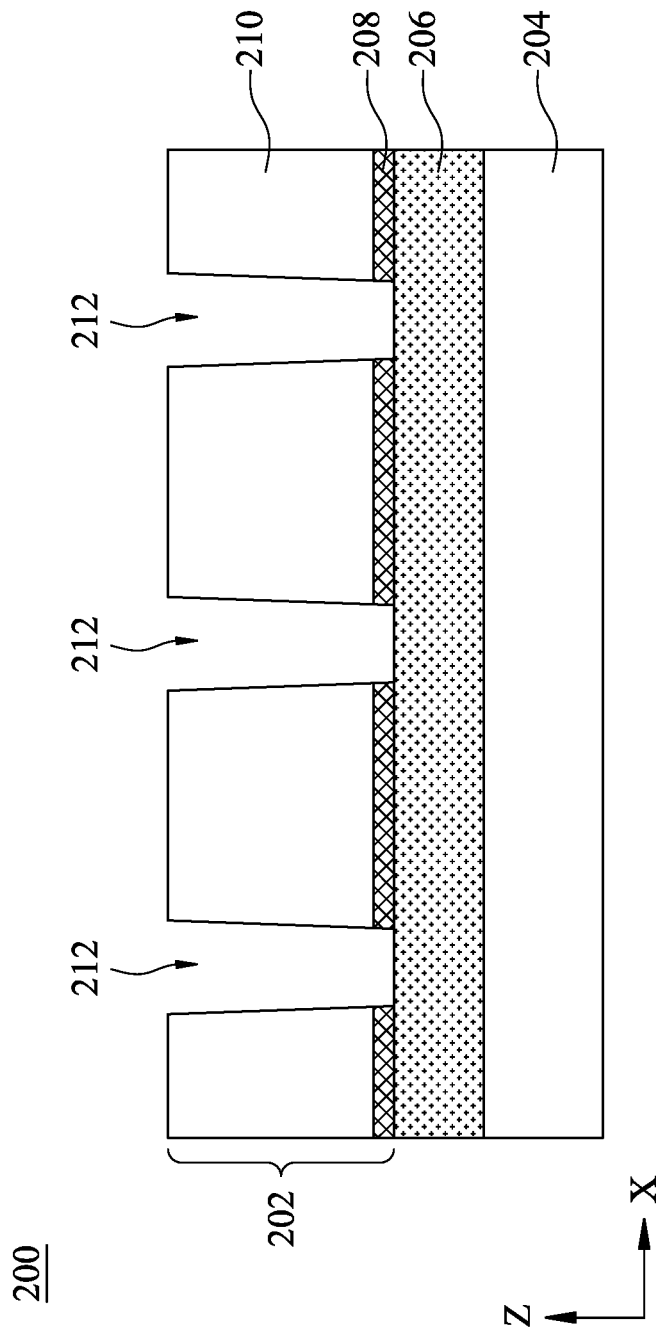

As shown in FIG. 4 and the operation 904 in FIG. 23, a trench 212 is formed in the first dielectric layer 210 along the z-direction. In some embodiments, the trench 212 may expose the ESL 208. In some embodiments, the trench 212 may expose a portion of the device layer 206. In some embodiments, the trench 212 may be formed by dry etch, wet etch, or other suitable processes.

Figure 5:
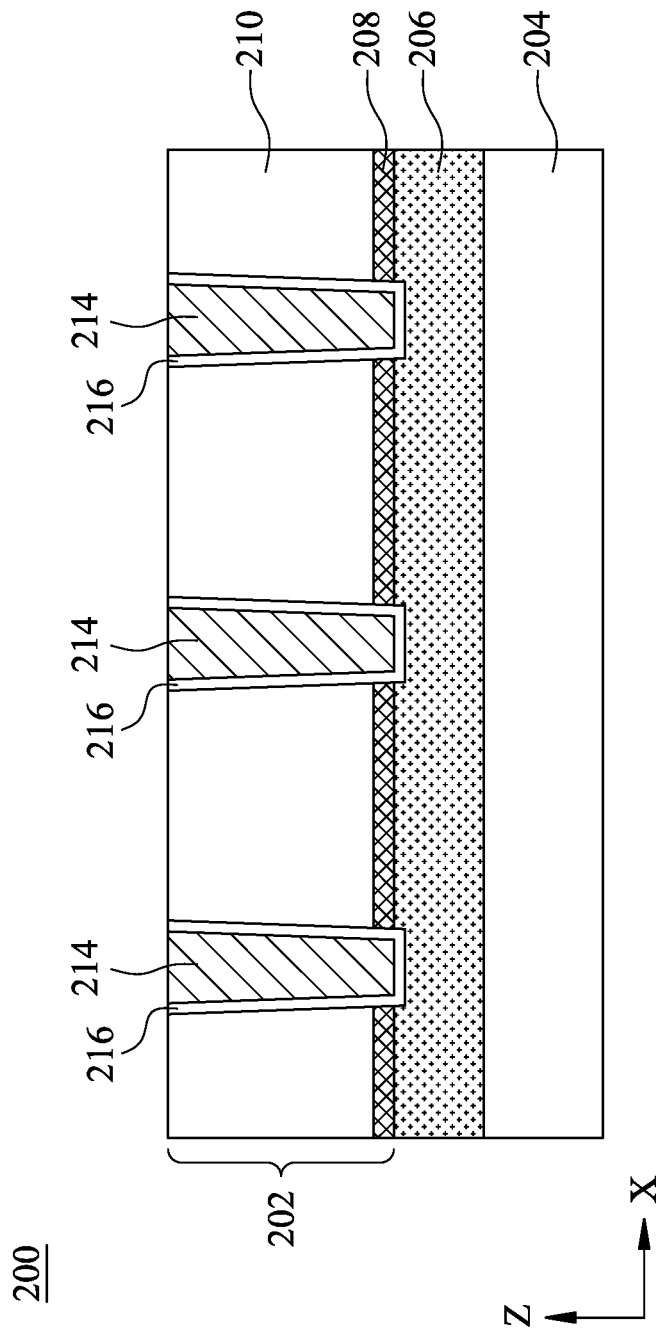

As shown in FIG. 5 and the operation 906 in FIG. 23, a conductive feature 214 is formed in the trench 212 in contact with the device layer 206. In some embodiments, a barrier layer 216 may be formed between the first dielectric layer 210 and the conductive feature 214. In some embodiments, the barrier layer 216 is deposited in the trench 212, and a conductive material, such as Cu, is deposited on the barrier layer 216. The deposition of the conductive material on the barrier layer 216 in the trench 212 may include forming a seed layer on the barrier layer 216 by PVD process and then forming the conductive material on the seed layer by electrodeposition process. The top surface of the conductive material is then planarized so that top surfaces of the conductive feature 214, the barrier layer 216, and the first dielectric layer 210 are substantially co-planar. In some embodiments, the conductive material (the conductive feature 214) may be Cu, Ni, Co, Ru, Jr, Al, Pt, Pd, Au, Ag, Os, W, Mo, the related alloys, or any combination thereof. In some embodiments, the conductive feature 214 may be formed by ALD, CVD, PVD, ELD, ECP, or other suitable processes.

Figure 6:
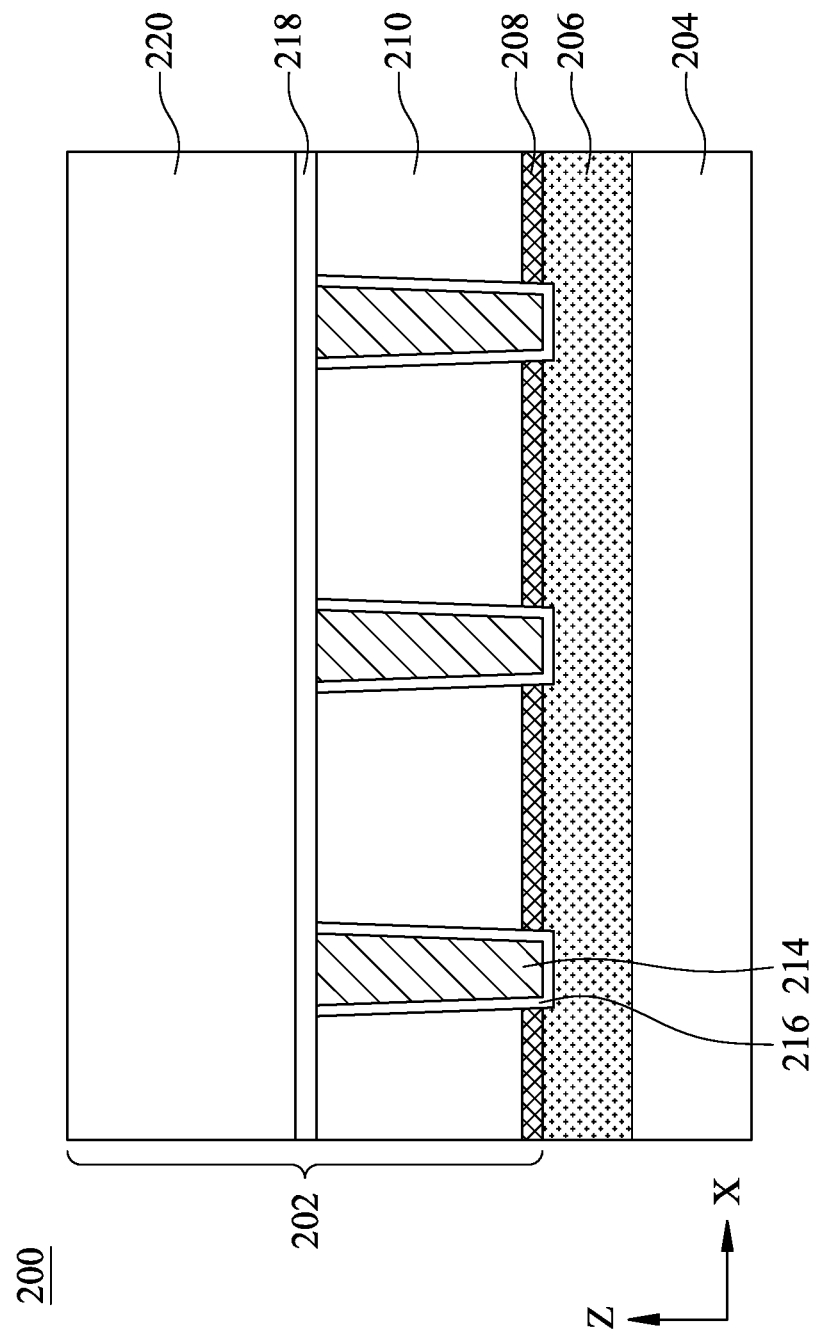

As shown in FIG. 6 and the operation 908 in FIG. 23, a second dielectric layer 220 is formed over the first dielectric layer 210 and the conductive feature 214. In some embodiments, a cap layer 218 may be formed between the second dielectric layer 220, and the first dielectric layer 210 and the conductive feature 214. In some embodiments, the cap layer 218 may cover the top surfaces of the first dielectric layer 210 and the conductive feature 214 as shown in FIG. 6.

In some embodiments, the cap layer 218 may include $SiC_x$, $SiN_x$, $SiC_xN_y$, $SiO_xN_y$, $BC_xN_y$, $AlO_xN_y$, $AlN_x$, $AlO_x$, or other suitable materials. In some embodiments, the cap layer 218 may include $SiC_x$, $SiN_x$, $SiC_xN_y$, $SiO_xN_y$, $BC_xN_y$, $AlO_xN_y$, $AlN_x$, or $AlO_x$ doped with Hf, Zr, Y, or other suitable materials. In some embodiments, the cap layer 218 may be formed in a temperature lower than 425 degrees Celsius by CVD, PVD, ALD, spin coating, or other suitable processes. In some embodiments, the cap layer 218 may be formed in a temperature between 150 degrees Celsius and 420 degrees Celsius by CVD, PVD, ALD, spin coating, or other suitable processes.

In some embodiments, the materials and manufacturing processes of the second dielectric layer 220 may be similar to those of the first dielectric layer 210. In some embodiments, the second dielectric layer 220 may include a SiCN based material having a hardness higher than 10 GPa and a dielectric constant in a range between 1.0 and 4.0. In some embodiments, the second dielectric layer 220 may include a BCN based material having a hardness higher than 10 GPa and a dielectric constant in a range between 1.0 and 4.0. In some embodiments, the second dielectric layer 220 may include $SiO_xC_y$ based material with ordered structure having a hardness higher than 10 GPa and a dielectric constant in a range between 1.0 and 3.0.

In some embodiments, the materials of the second dielectric layer 220 may be different from those of the first dielectric layer 210. In some embodiments, the second dielectric layer 220 may include a silicon-containing material, such as SiCO, SiCN, SiN, SiCON, $SiO_x$, SiC, SiCOH, or SiON. In some embodiments, the second dielectric layer 220 includes a low-k dielectric material having a k value ranging from about 2 to about 3.6, such as SiCOH. In some embodiments, the second dielectric layer 220 may be formed by CVD, ALD, PECVD, PEALD, or other suitable process.

Figure 7:
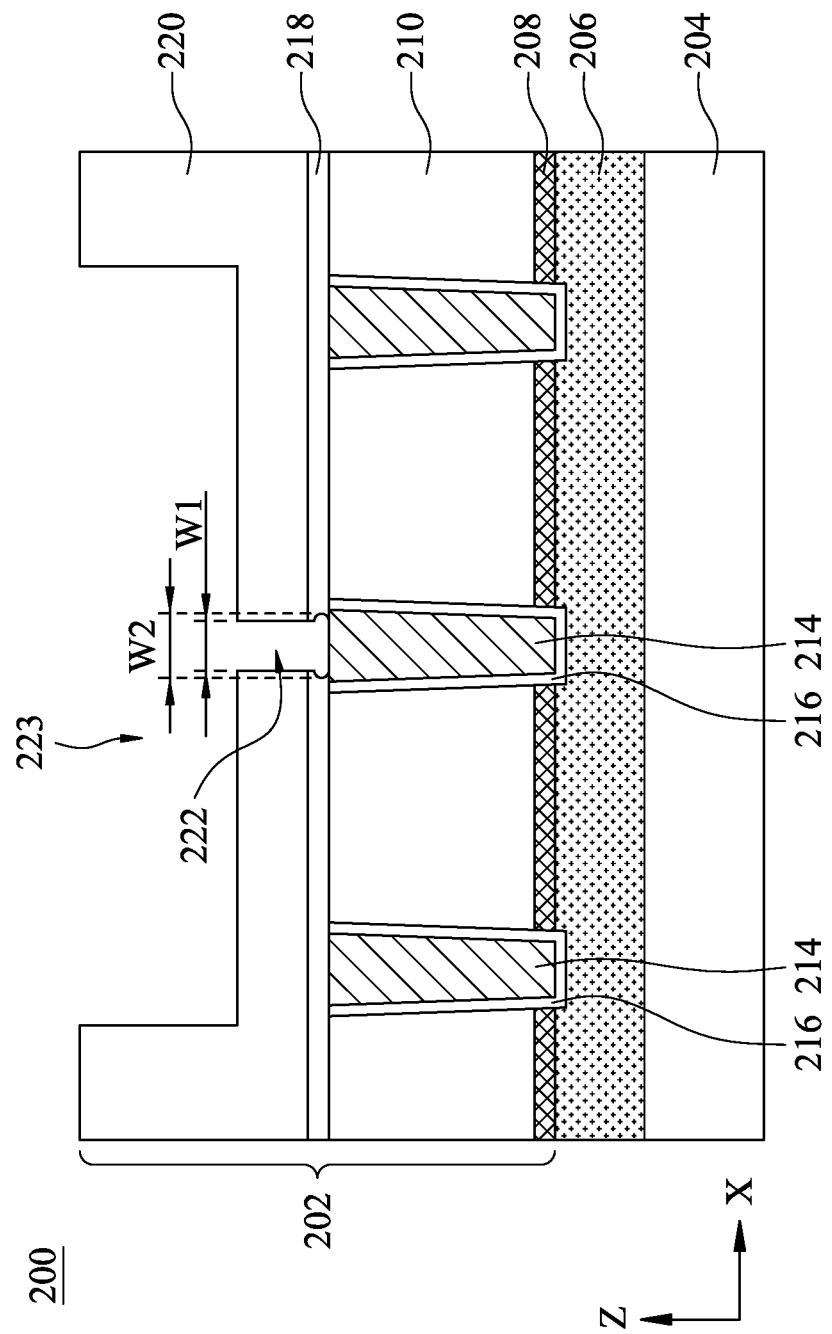
Figure 8:
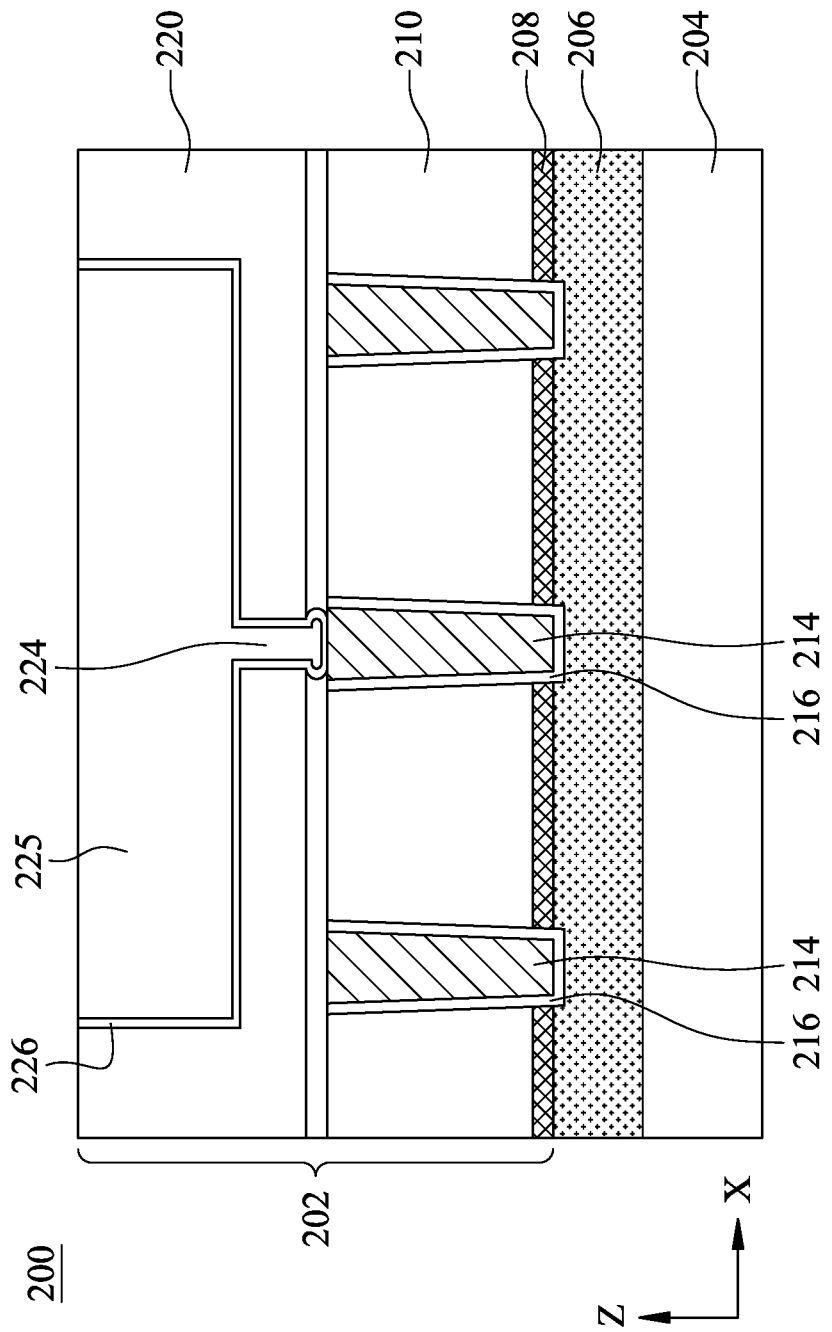

As shown in FIG. 7, a via opening 222 and a trench opening 223 may be formed in the second dielectric layer 220. Then, as shown in FIG. 8 and the operation 910 in FIG. 23, a via structure 224 and a contact structure 225 may be formed in the second dielectric layer 220 in contact with the conductive feature 214. In some embodiments, the via structure 224 and the contact structure 225 may be formed by dual damascene, single damascene, semi damascene, or other suitable processes. The trench opening 223 has a width larger than that of the via opening 222. In some embodiments, the via opening 222 may expose the conductive feature 214.

By using the damascene process as an example, as shown in FIG. 7, the via opening 222 and the trench opening 223 may be formed in the second dielectric layer 220. In some embodiments, the via opening 222 may expose the conductive feature 214. A barrier layer 226 (e.g., TiN, TaN, or the like) is then deposited in the via opening 222 and the trench opening 223, and a conductive material, such as Cu, is deposited on the barrier layer 226. The deposition of the conductive material on the barrier layer 226 in the via opening 222 and the trench opening 223 may include forming a seed layer on the barrier layer 226 by PVD process and then forming the conductive material on the seed layer by electrodeposition process. The top surface of the conductive material is then planarized so that top surfaces of the contact structure 225, the barrier layer 226, and the second dielectric layer 220 are substantially co-planar.

As shown in FIG. 7, when forming the via opening 222, because the etching resistance of the cap layer 218 and the second dielectric layer 220 are different, the bottom portion of the via opening 222 formed in the cap layer 218 may have a width W2, and the upper portion of the via opening 222 formed in the second dielectric layer 220 may have a width W1, as shown in FIG. 7. In some embodiments, W2 is larger than W1. As a result, after the formation of the via structure 224, the bottom portion of the via structure 224 formed in the cap layer 218 may have a width W2, and the upper portion of the via structure 224 formed in the second dielectric layer 220 may have a width W1, wherein W2 is larger than W1, as shown in FIG. 8. In other words, the bottom portion of the via structure 224, which is in direct contact with the conductive feature 214, includes an extended portion protruding along the x-direction perpendicular to an extension direction (the z-direction) of the via structure 224.

Figure 9:
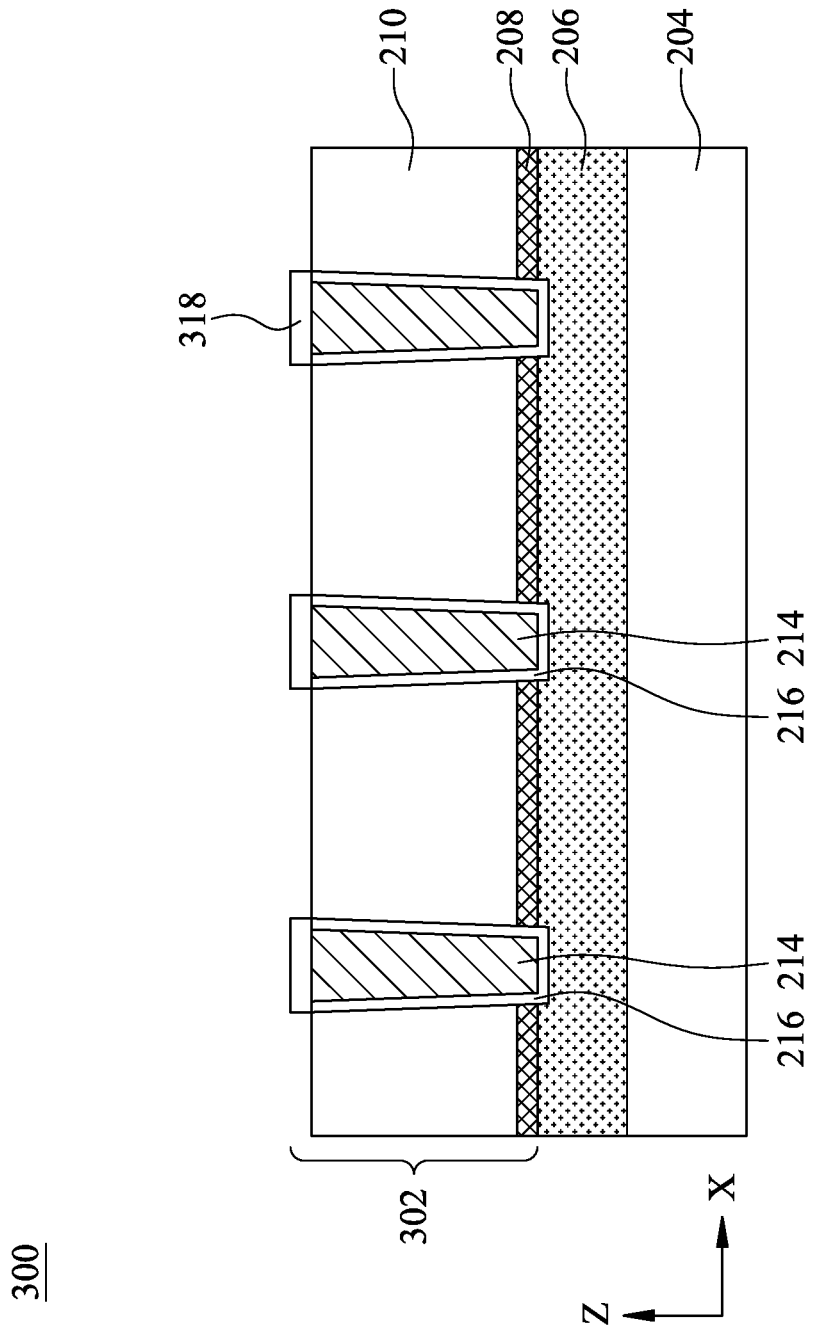
FIGS. 9-10 are cross-sectional side views of various stages of manufacturing another semiconductor device structure, in accordance with some embodiments.
Figure 10:
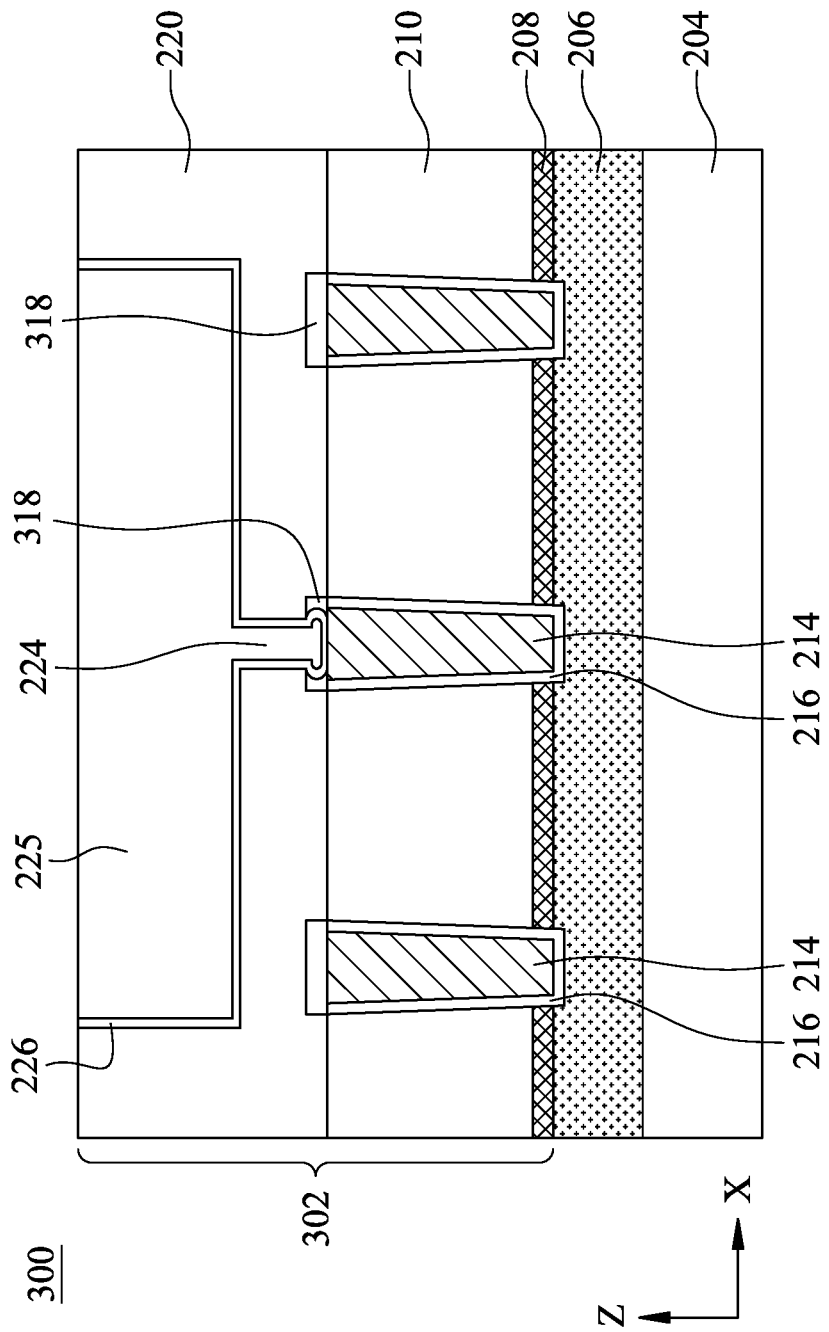

FIGS. 9-10 are cross-sectional side views of various stages of manufacturing another semiconductor device structure 300, including an interconnection structure 302, in accordance with some embodiments. In some embodiments, the semiconductor substrate 204, the device layer 206, the ESL 208, the first dielectric layer 210, the conductive feature 214, and the barrier layer 216 of the semiconductor device structure 300 may be similar to those of the semiconductor substrate 204, the device layer 206, the ESL 208, the first dielectric layer 210, the conductive feature 214, and the barrier layer 216 of the semiconductor device structure 200.

As shown in FIG. 9, a metal liner layer 318 may be selectively formed on top surfaces of the conductive feature 214. In some embodiments, the metal liner layer 318 may include SiNx or other suitable materials.

The formation of the metal liner layer 318 may be a metal-catalyzed process so that the metal liner layer 318 is formed on the metallic surfaces of each portion of the conductive feature 214 but not on the dielectric surfaces of the first dielectric layer 210. In such embodiments, the metal liner layer 318 may include a two-dimensional (2D) material. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to Hf, Tee, $WS_2$, $MoS_2$, $WSe_2$, $MoSe_2$, or any combination thereof. In some embodiments, the metal liner layer 318 may include graphene. In some embodiments, the metal liner layer 318 may be formed in the temperature between 450 degrees Celsius and 150 degrees Celsius by ALD or other suitable processes.

Because the selective deposition operation will be affected by temperature, in some embodiments, the metal liner layer 318 may be formed in the temperature between 150 degrees Celsius and 450 degrees Celsius by CVD, PVD, ALD or other suitable processes. For example, the metal liner layer 318 may be formed in the temperature lower than 200 degrees Celsius by a thermal ALD process. In some embodiments, the metal liner layer 318 may prevent the metal diffusion from the conductive feature 214 to the second dielectric layer 220 formed in a later process.

In another embodiments that the metal liner layer 318 includes SiNx, the metal liner layer 318 may be formed by using $Si(CH_3)_4$ with $NH_3$. In some embodiments, the metal liner layer 318 may be formed in the temperature between 25 degrees Celsius (room temperature) and 250 degrees Celsius by CVD, PVD, ALD or other suitable processes.

In some embodiments, a plasma treatment may be performed to remove the metal oxide formed on the top surface of the conductive feature 214, thereby promoting selective deposition of the metal liner layer 318, such as SiNx or graphene, on the top surface of the conductive features 214. The plasma treatment may include single or multi-step processes, each of which may contain hydrogen-based gas, ammonia-based gas or argon-based gas. The plasma treatment may also modify the surface of the first dielectric layer 210 such that the metal liner layer 318, such as SiNx or graphene, growth is suppressed on the surface of the first dielectric layer 210. Accordingly, it is possible to selectively deposit the metal liner layer 318, such as SiNx or graphene, on the conductive feature 214, e.g., Cu, only. During the plasma treatment, the substrate temperature is maintained at a temperature in a range from about 25 degrees Celsius (room temperature) to about 425 degrees Celsius. In some embodiments, the input power of the plasma is in a range from about 100 W to about 1000 W.

In some embodiments, a self-assembled monolayer (SAM) (not shown) is formed on the surface of the first dielectric layer 210, which can further suppress the deposition of the metal liner layer 318. The SAM may be made of a silane-based material, a phosphate-based material, an amine-based material and/or a thiol-based material. In some embodiments, the plasma treatment may be omitted. After the plasma treatment (or SAM process), the metal liner layer 318, such as SiNx or graphene, is selectively formed on the surface of the conductive feature 214.

As shown in FIG. 10, the second dielectric layer 220 is formed over the first dielectric layer 210, the conductive feature 214, and the metal liner layer 318. Then, the via structure 224 and the contact structure 225 may be formed in the second dielectric layer 220 in contact with the conductive feature 214. In some embodiments, the materials and the manufacturing processes of the second dielectric layer 220, the barrier layer 226, the via structure 224, and the contact structure 225 of the semiconductor device structure 300 may be similar to those of the second dielectric layer 220, the barrier layer 226, the via structure 224, and the contact structure 225 of the semiconductor device structure 200.

As shown in FIG. 10, the bottom portion of the via structure 224 formed in the metal liner layer 318 may have a width larger than the upper portion of the via structure 224 formed in the second dielectric layer 220. In other words, the bottom portion of the via structure 224 in direct contact with the conductive feature 214 includes an extended portion protruding along the x-direction perpendicular to an extension direction (the z-direction) of the via structure 224.

Figure 11:
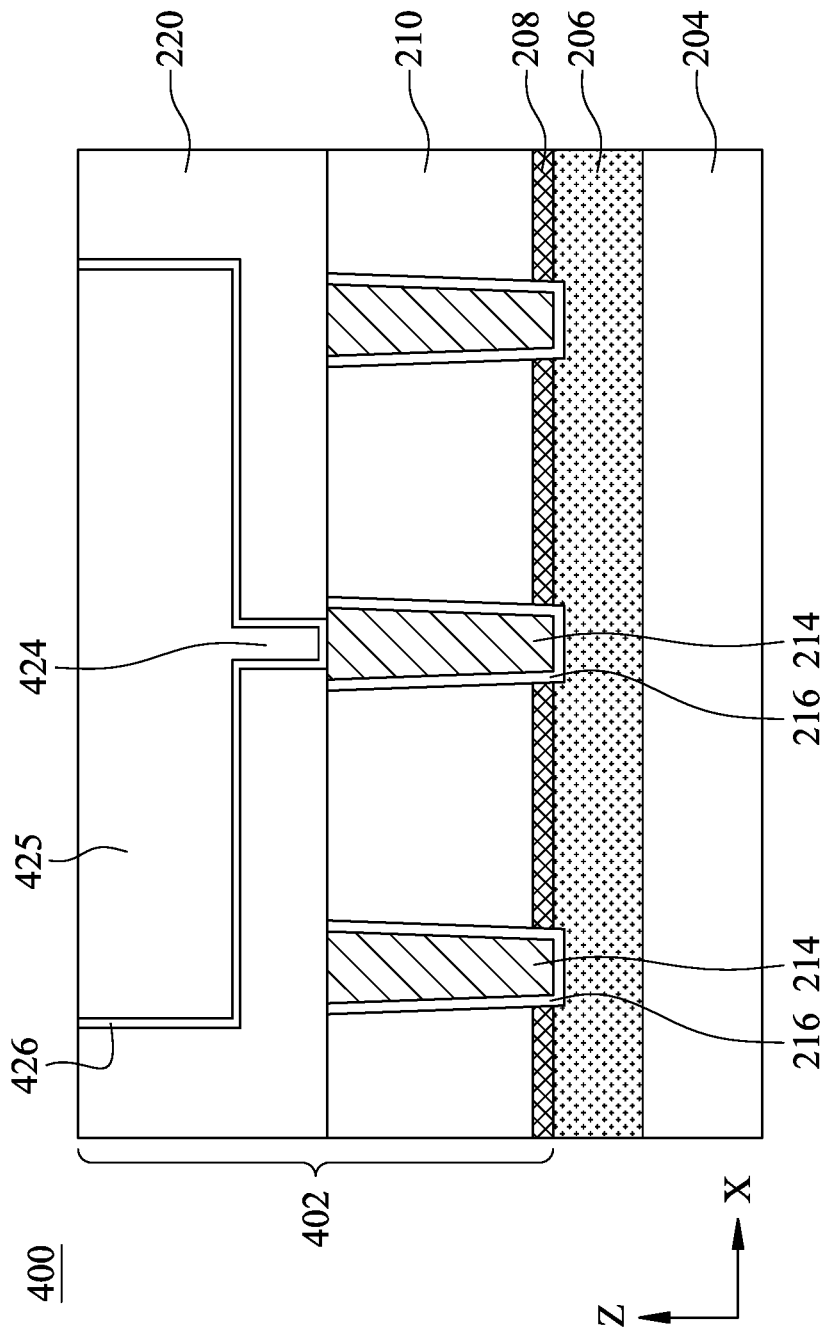
FIG. 11 is a cross-sectional side view of a further semiconductor device structure, in accordance with some embodiments.

FIG. 11 is a cross-sectional side view of a further semiconductor device structure 400, including an interconnection structure 402, in accordance with some embodiments. In some embodiments, the semiconductor substrate 204, the device layer 206, the ESL 208, the first dielectric layer 210, the conductive feature 214, and the barrier layer 216 of the semiconductor device structure 400 may be similar to those of the semiconductor substrate 204, the device layer 206, the ESL 208, the first dielectric layer 210, the conductive feature 214, and the barrier layer 216 of the semiconductor device structure 200 or 300.

After forming the conductive feature 214 in the first dielectric layer 210, the semiconductor device structure 400 does not include a cap layer or a metal liner layer on the conductive feature 214. In some embodiments, the second dielectric layer 220 is formed over the first dielectric layer 210 and the conductive feature 214.

Then, a via structure 424 and a contact structure 425 may be formed in the second dielectric layer 220 in contact with the conductive feature 214. For forming the via structure 424, a via opening and a trench opening may be first formed in the second dielectric layer 220. In some embodiments, the via opening may expose the conductive feature 214. A barrier layer 426 is then deposited in the via opening and the trench opening, and a conductive material, such as Cu, is deposited on the barrier layer 426. The deposition of the conductive material on the barrier layer 426 in the via opening and the trench opening may include forming a seed layer on the barrier layer 426 by PVD process and then forming the conductive material on the seed layer by electrodeposition process. The top surface of the conductive material is then planarized so that top surfaces of the contact structure 425, the barrier layer 426, and the second dielectric layer 220 are substantially coplanar.

The first dielectric layer 210 having higher hardness (10 GPa or greater) and higher mechanical strength is advantageous in cases where misalignment occurs. For example, in some embodiments, when the opening for forming the via structure 424 is misaligned with the conductive feature 214, because of the material of first dielectric layer 210 has a hardness higher than 10 GPa that has high mechanical strength, the etch operation for forming the opening will not damage or hardly damage the first dielectric layer 210.

Figure 24:
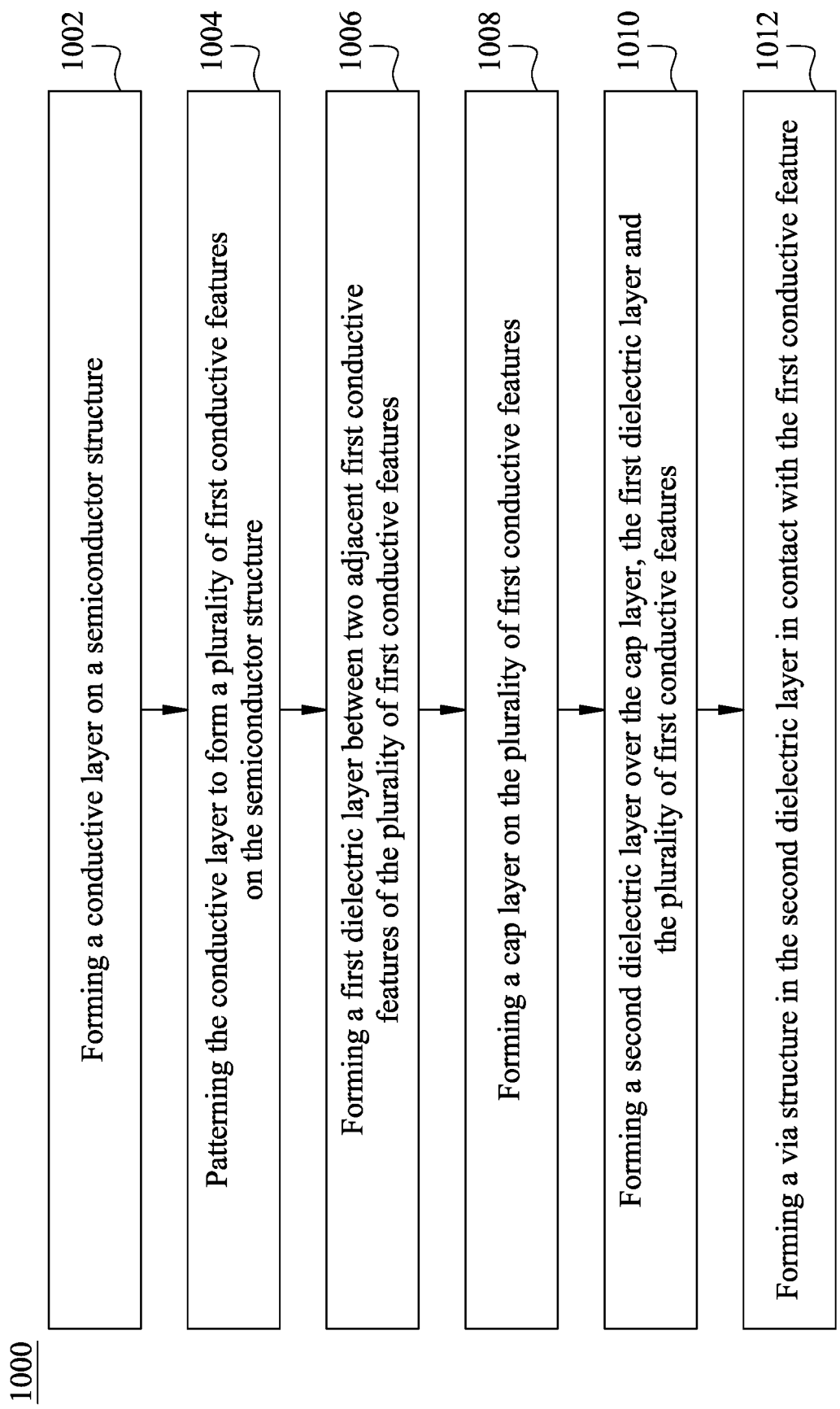
FIG. 24 is a flow chart of another method for manufacturing a semiconductor interconnection structure in accordance with some embodiments.

FIGS. 12-18 are cross-sectional side views of various stages of manufacturing a semiconductor device structure 500, including an interconnection structure 502, in accordance with some embodiments. FIG. 24 is a flow chart of a method 1000 for manufacturing the interconnection structure 502 in accordance with some embodiments. For the purpose of better describing the present disclosure, the cross-sectional side views of the semiconductor device structure 500 in FIGS. 12-18 and the method 1000 in FIG. 24 will be discussed together. It is understood that the operations shown in the method 1000 are not exhaustive and that other operations may be performed as well before, after, or between any of the illustrated operations. Further, some of the operations may be performed simultaneously, or in a different order than shown in FIGS. 12-18 and FIG. 24.

Figure 12:
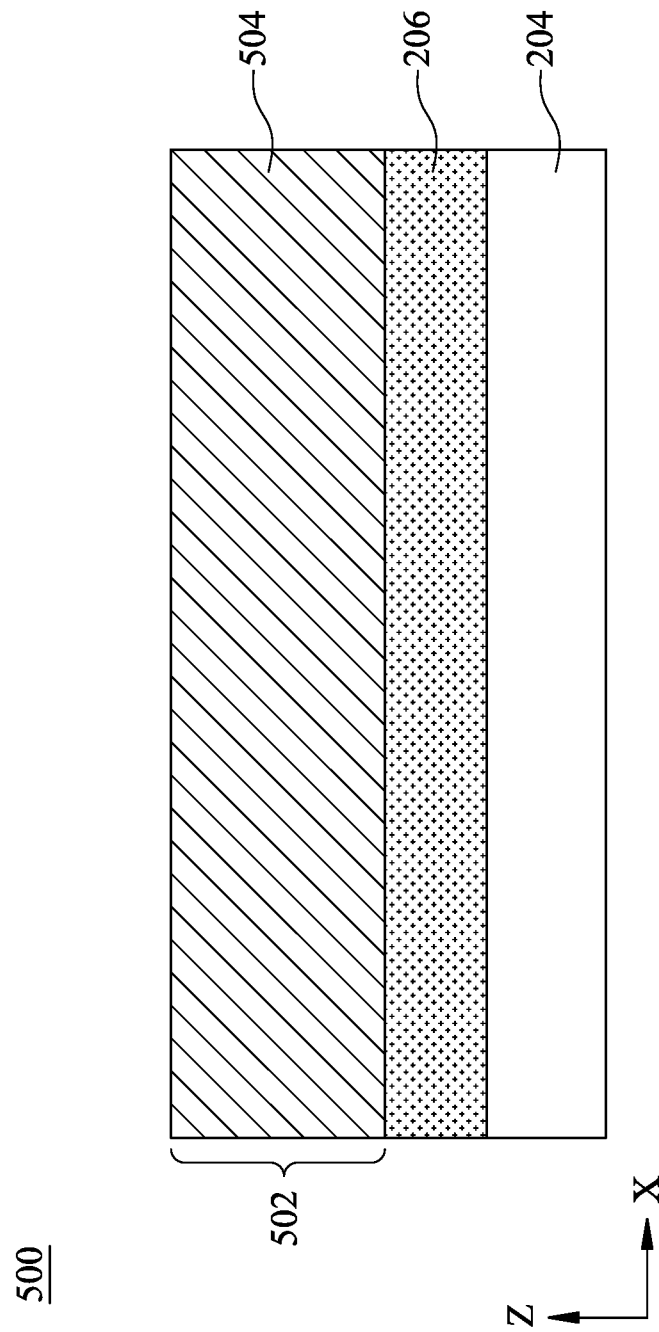
FIGS. 12-18 are cross-sectional side views of various stages of manufacturing still a further semiconductor device structure, in accordance with some embodiments.

The semiconductor substrate 204 is provided and the device layer 206 is formed on the semiconductor substrate 204. As shown in FIG. 12 and the operation 1002 in FIG. 24, a conductive layer 504 is formed on the device layer 206. In some embodiments, the conductive layer 504 may be Cu, Ni, Co, Ru, Jr, Al, Pt, Pd, Au, Ag, Os, W, Mo, the related alloys, or any combination thereof. In some embodiments, the conductive layer 504 may be formed by ALD, CVD, PVD, ELD, ECP, or other suitable processes. In some embodiments, an etch stop layer (not shown), may be formed between the conductive layer 504 and the device layer 206.

Figure 13:
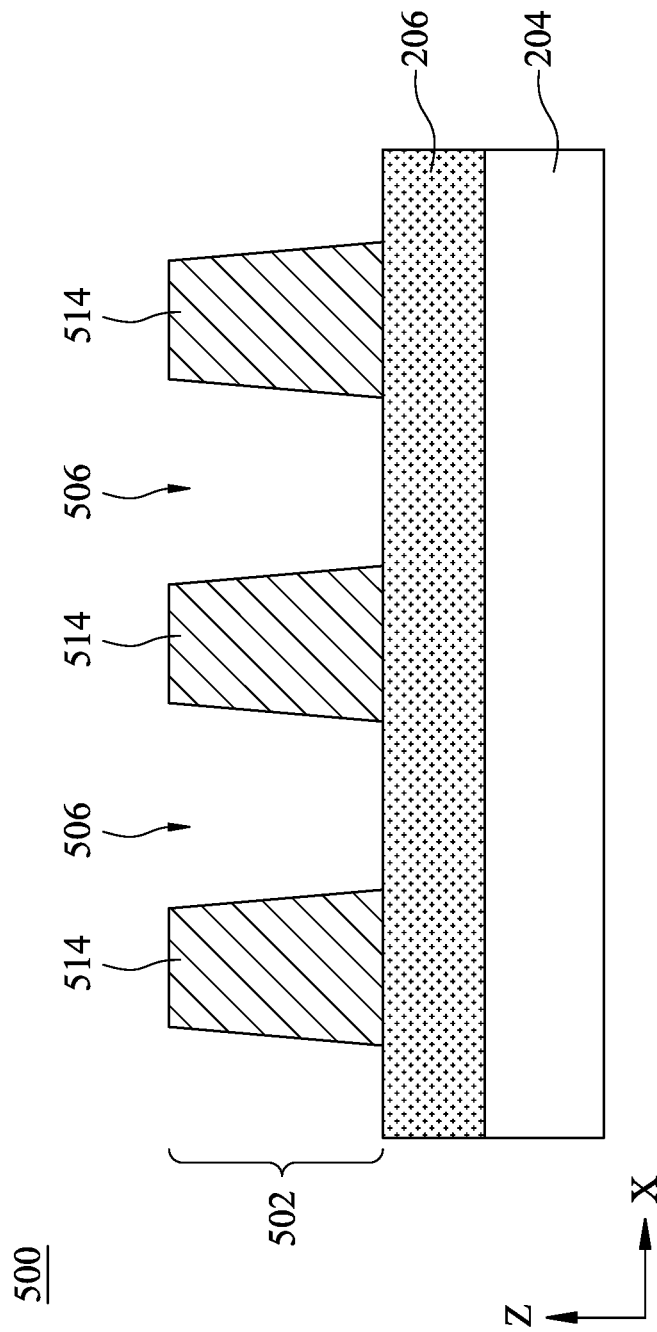

As shown in FIG. 13 and the operation 1004 in FIG. 24, the conductive layer 504 is patterned to form a plurality of conductive features 514. In some embodiments, the conductive layer 504 is patterned by wet etch, dry etch, or any suitable processes. In some embodiments, the plurality of conductive features 514 may be formed by patterning a hard mask layer over the conductive layer 504, then etching the conductive layer 504 using the patterned hard mask by a suitable etching process, such as a directional ion etch. The plurality of conductive features 514 may be conductive lines separated by a plurality of openings 506. The openings 506 may be trenches. The conductive features 514 may include an electrically conductive material, such as Cu, Ni, Co, Ru, Jr, Al, Pt, Pd, Au, Ag, Os, W, Mo, the related alloys, or any combination thereof.

Figure 14:
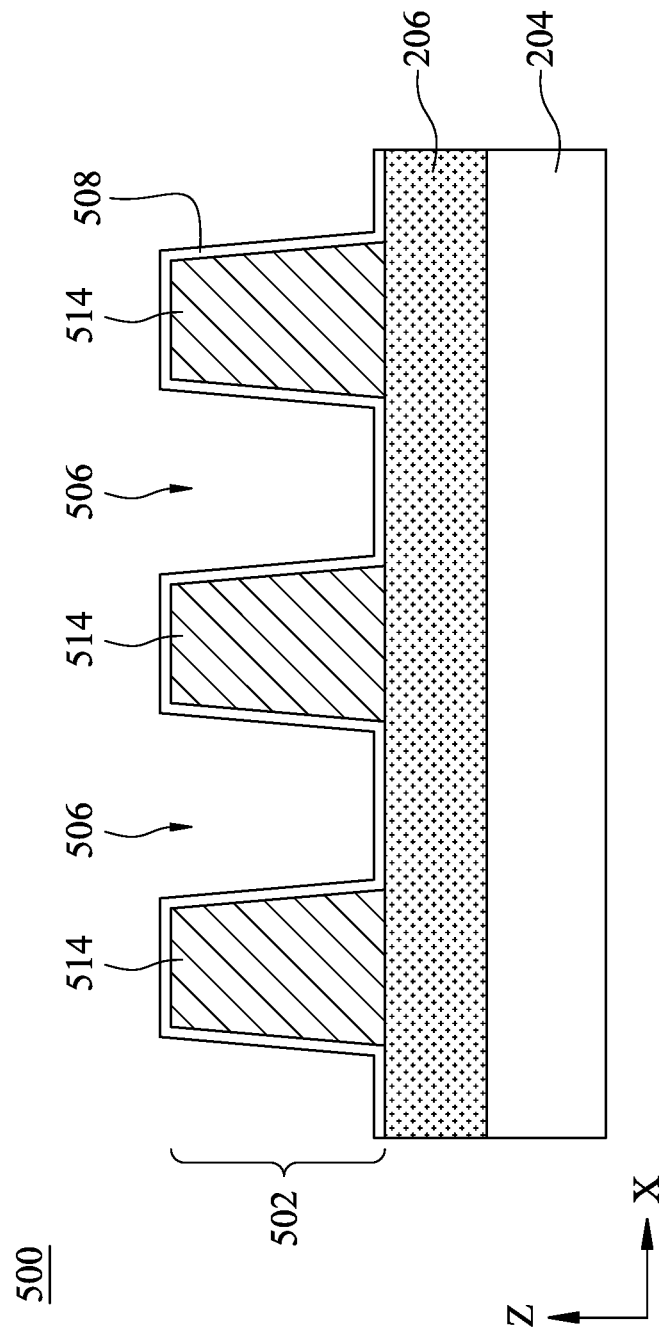

In some embodiments, as shown in FIG. 14, after etching the conductive layer 504 to form the conductive features 514, a barrier layer 508 may be formed on exposed surfaces of the plurality of conductive features 514 to prevent diffusion of the conductive material into adjacent regions. The barrier layer 508 may be a metal nitride layer, such as TaN, or oxygen-doped silicon carbide (SiC:O, also known as ODC), or any suitable material.

Figure 15:
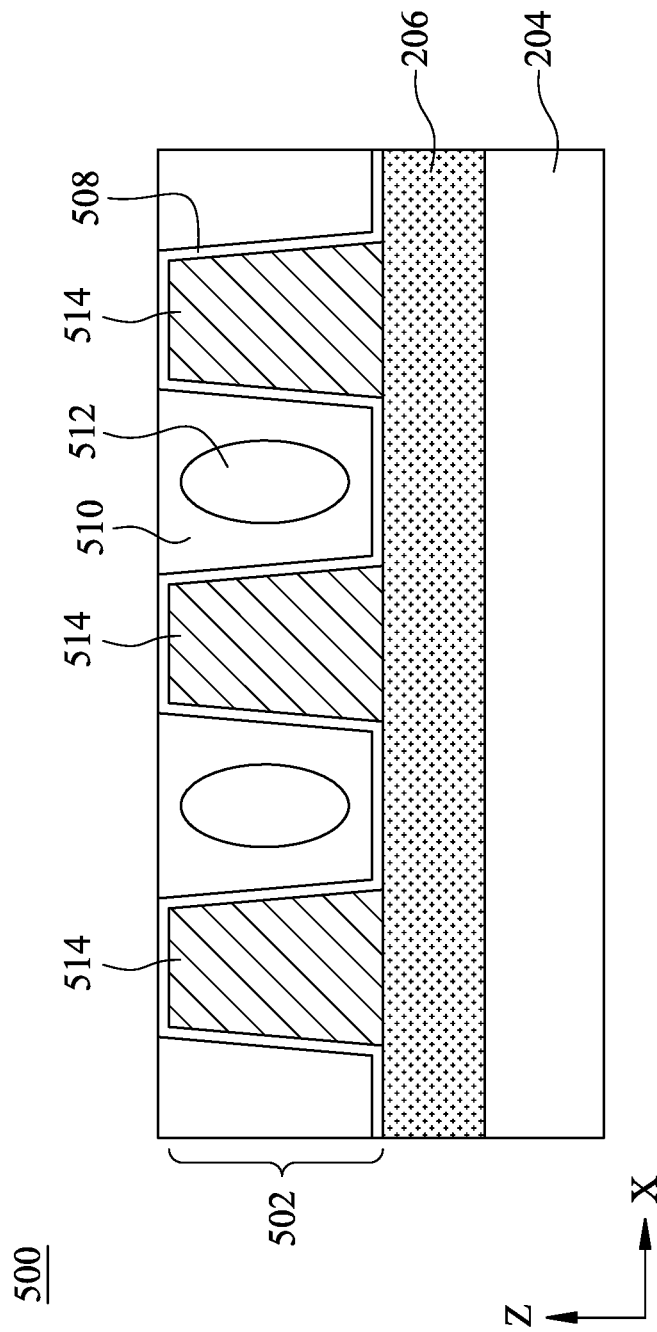

As shown in FIG. 15 and the operation 1006 in FIG. 24, a first dielectric layer 510 may be formed between two adjacent conductive features 514 of the plurality of conductive features 514. In some embodiments, the first dielectric layer 510 has an air gap 512 formed between two adjacent conductive features 514. The air gap 512 may be formed during the deposition process due to early closure of a high aspect ratio opening formed between the neighboring conductive features 514. In some embodiments, the first dielectric layer 510 may be deposited by a suitable deposition process to form the air gap 512 therein. For example, the first dielectric layer 510 is deposited by a CVD process, such as a flowable CVD process. The formation of the first dielectric layer 510 is tuned to effectively close up an upper portion of the openings 506 resulting in the air gaps 512. The parameters in the CVD process, such as pressure, temperature, reactant viscosity, may be tuned in a way such that a gap fill behavior of dielectric materials maintains the air gap 512 without filling up the openings 506. The air gap 512 in FIG. 15 is shown in oval shapes. However, the air gap 512 may have other shapes depending on the dimension of the openings 506, and/or process parameters used to deposit the first dielectric layer 510. For example, the air gaps 512 may have a triangular shape, such as an inverted triangle shape.

After deposition of the first dielectric layer 510, a planarization process, such as a CMP process, is performed to expose the barrier layer 508 formed on the top surfaces of the plurality of conductive features 514. In some embodiments, the barrier layer 508 formed on the top surfaces of the plurality of conductive features 514 may be removed in the CMP process.

In some embodiments, the first dielectric layer 510 may be a silicon carbo-nitride (SiCN) based material having a hardness higher than 10 GPa and a dielectric constant in a range between 1.0 and 4.0. The first dielectric layer 510 may include the same material as the first dielectric layer 210 and may be formed in a similar fashion as discussed above with respect to FIG. 3. For example, in some embodiments, the first dielectric layer 510 may be a boron carbo-nitride (BCN) based material having a hardness higher than 10 GPa and a dielectric constant in a range between 1.0 and 4.0. In some embodiments, the first dielectric layer 510 may be a BCN based material having a hardness higher than 10 GPa and a dielectric constant in a range between 1.0 and 3.0. In some embodiments, the first dielectric layer 510 may be a silicon oxide carbide (SiOC) based material with ordered structure having a hardness higher than 10 GPa and a dielectric constant in a range between 1.0 and 4.0. In some embodiments, the first dielectric layer 510 may be a SiOC based material with ordered structure having a hardness higher than 10 GPa and a dielectric constant in a range between 1.0 and 3.0.

Figure 16:
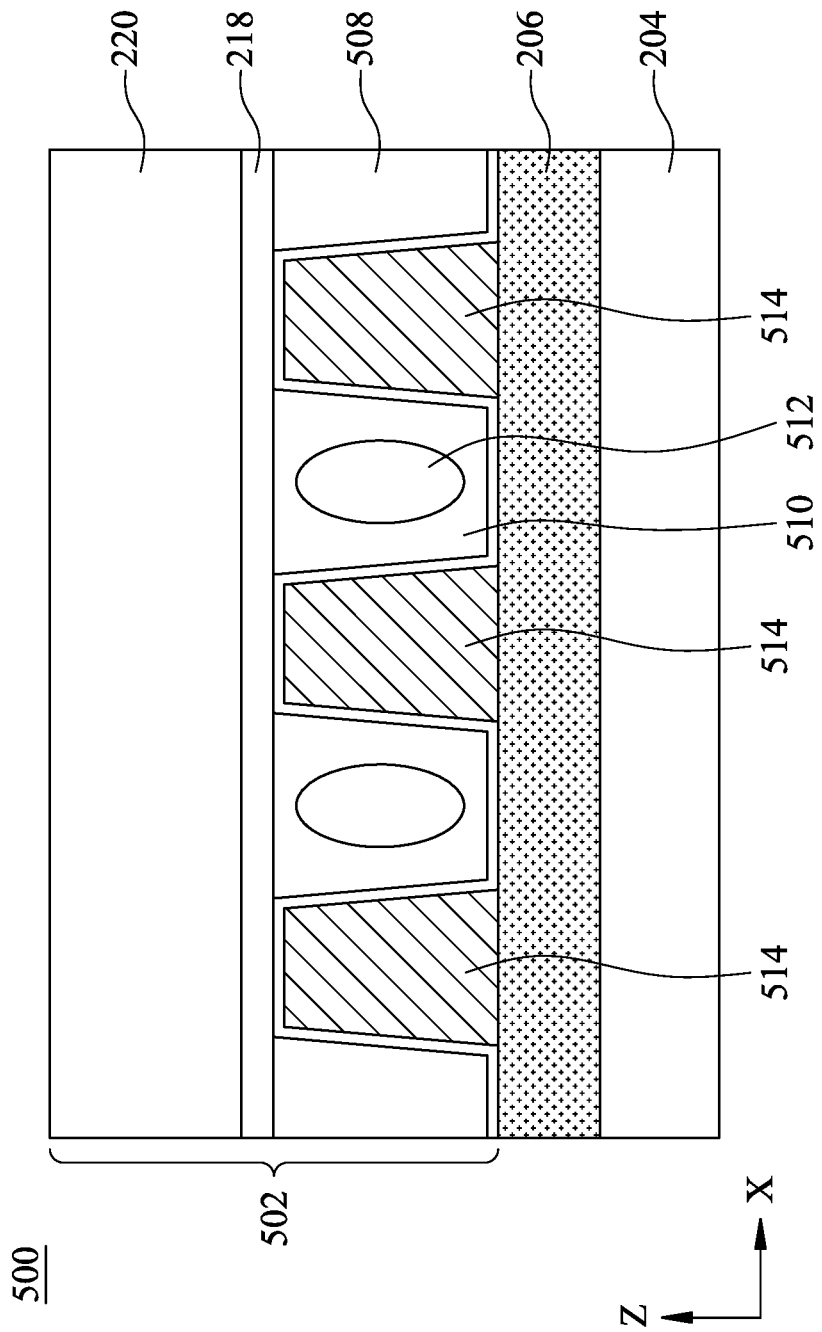
Figure 20:
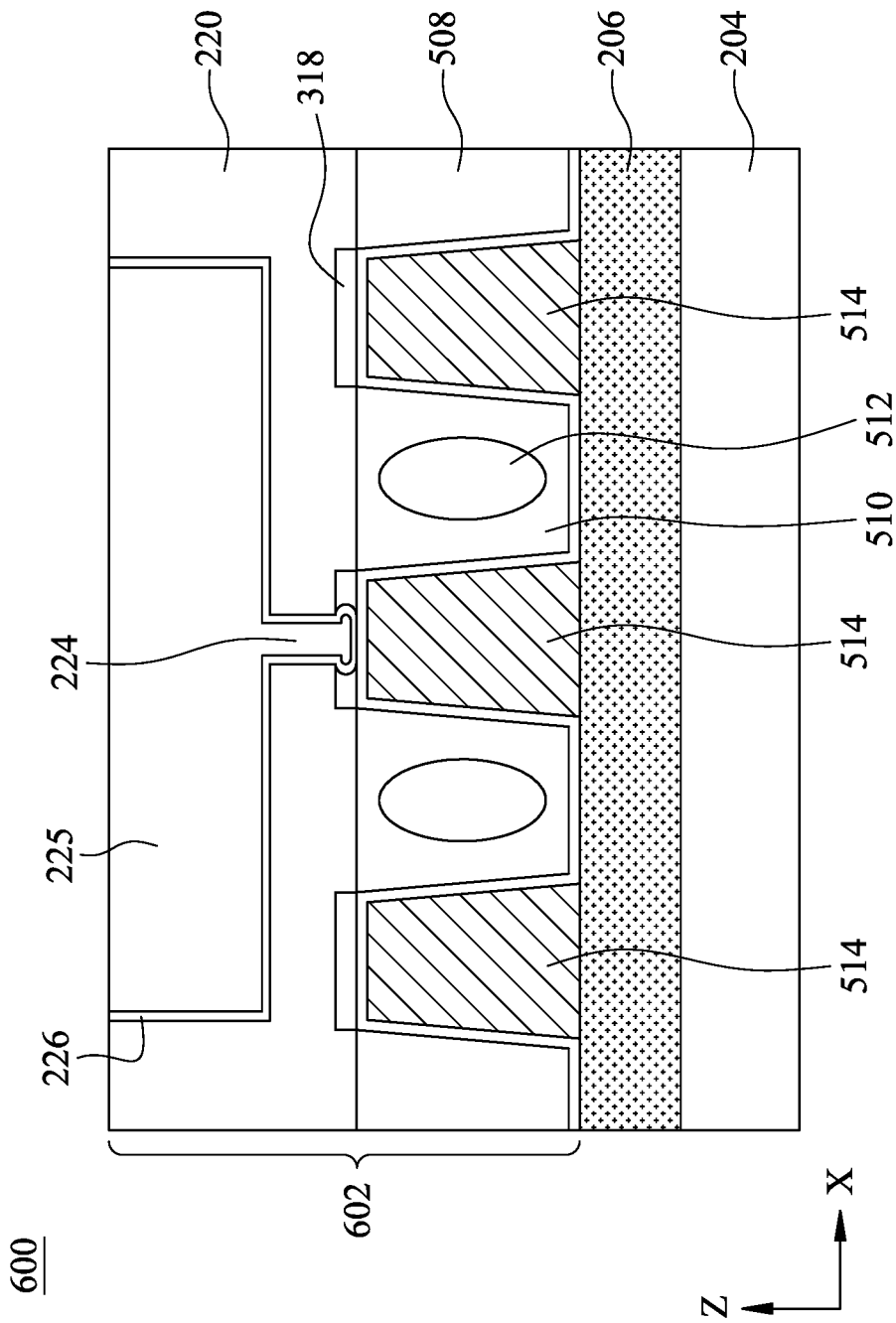

As shown in FIG. 16 and the operation 1008 in FIG. 24, the cap layer 218 is formed on the plurality of conductive features 514. Then, as shown in FIG. 16 and the operation 1010 in FIG. 24, the second dielectric layer 220 is formed over the cap layer 218. In some embodiments, the cap layer 218 may be formed covering the conductive features 514 and the first dielectric layer 510, as shown in FIG. 16. In some embodiments, the cap layer 218 may be formed covering only the conductive features 514, as shown in FIG. 20.

In some embodiments, the materials and the manufacturing processes of the cap layer 218 and the second dielectric layer 220 of the semiconductor device structure 500 may be similar to those of the cap layer 218 and the second dielectric layer 220 of the semiconductor device structure 200.

Figure 17:
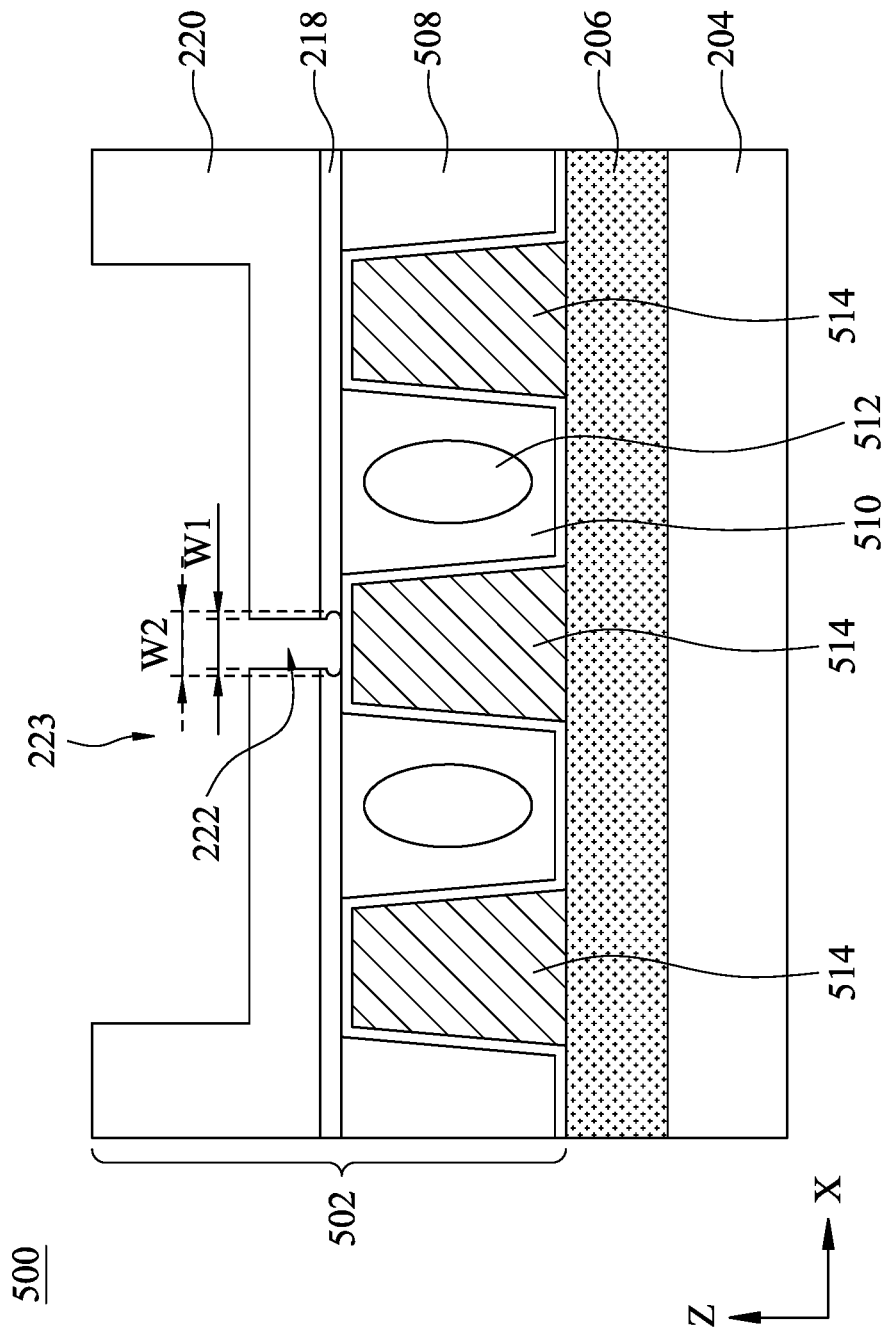
Figure 18:
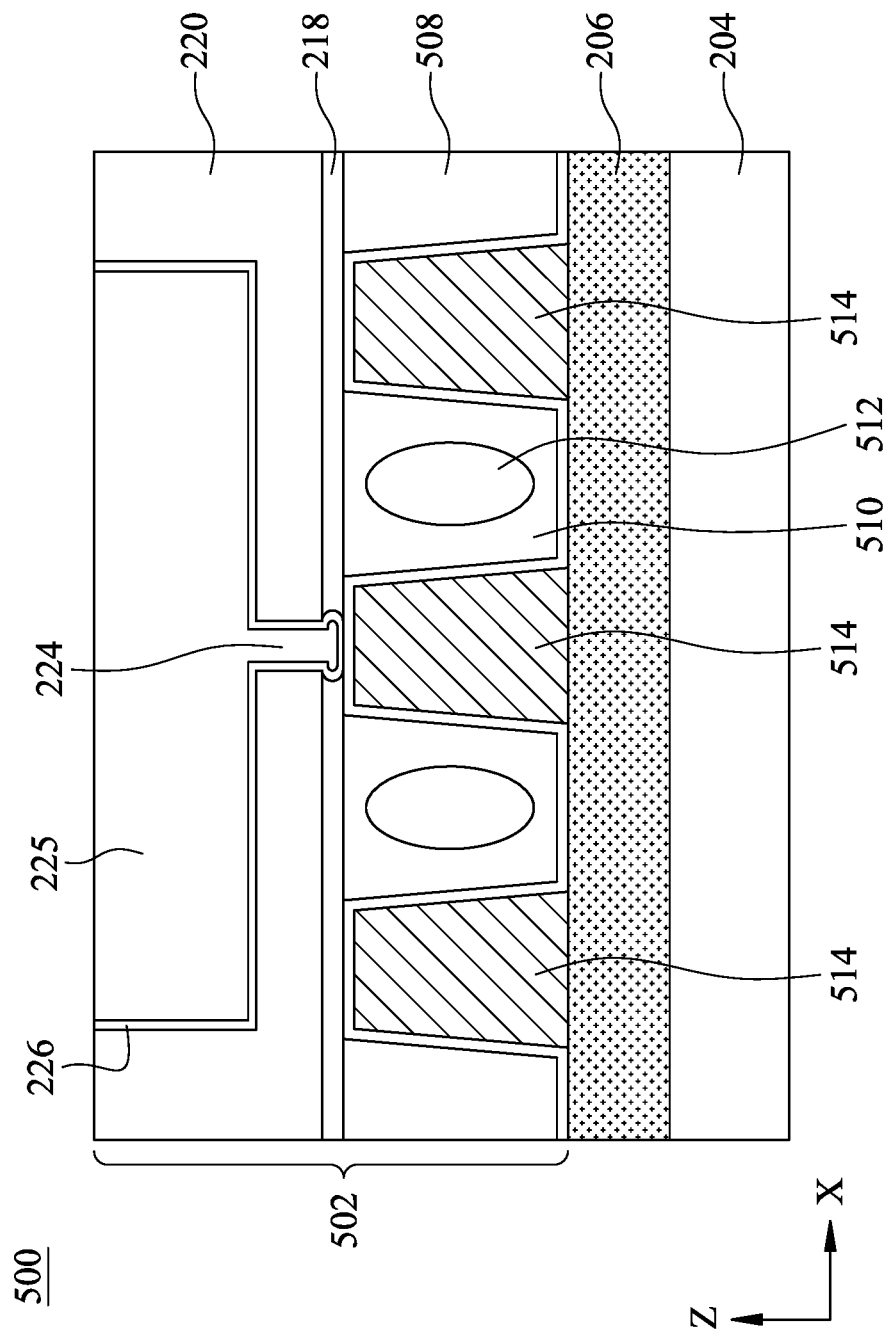

As shown in FIG. 17, the via opening 222 and the trench opening 223 are formed in the second dielectric layer 220. In some embodiments, the via opening 222 may expose the conductive feature 514. The trench opening 223 has a width larger than that of the via opening 222. Then, as shown in FIG. 18 and the operation 1012 in FIG. 24, the via structure 224 and the contact structure 225 may be formed in the second dielectric layer 220 in contact with the conductive feature 514. In some embodiments, the via structure 224 and the contact structure 225 may be formed by dual damascene, single damascene, semi damascene, or other suitable processes. In some embodiments, the materials and the manufacturing processes of the via structure 224 and the contact structure 225 of the semiconductor device structure 500 may be similar to those of the via structure 224 and the contact structure 225 of the semiconductor device structure 200.

As shown in FIG. 17, when forming the via opening 222, because the etching resistance of the cap layer 218 and the second dielectric layer 220 are different, the bottom portion of the via opening 222 formed in the cap layer 218 may have a width W2, and the upper portion of the via opening 222 formed in the second dielectric layer 220 may have a width W1, as shown in FIG. 17. In some embodiments, W2 is larger than W1. As a result, after the formation of the via structure 224, the bottom portion of the via structure 224 formed in the cap layer 218 may have a width W2, and the upper portion of the via structure 224 formed in the second dielectric layer 220 may have a width W1, wherein W2 is larger than W1, as shown in FIG. 18. In other words, the bottom portion of the via structure 224, which is in direct contact with the conductive feature 514, includes an extended portion protruding along the x-direction perpendicular to an extension direction (the z-direction) of the via structure 224.

Figure 19:
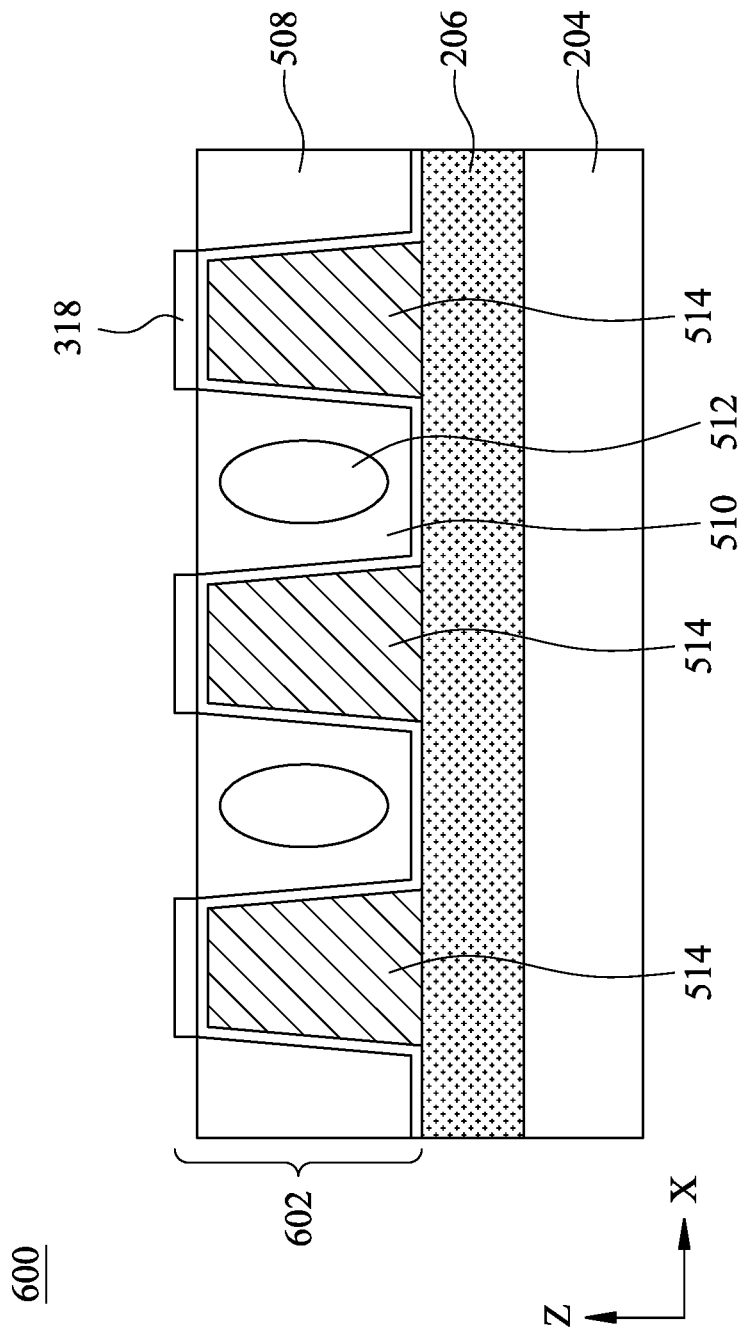
FIGS. 19-20 are cross-sectional side views of various stages of manufacturing still a further semiconductor device structure, in accordance with some embodiments.

FIGS. 19-20 are cross-sectional side views of various stages of manufacturing another semiconductor device structure 600, including an interconnection structure 602, in accordance with some embodiments. In some embodiments, the materials and the manufacturing processes of the semiconductor substrate 204, the device layer 206, the first dielectric layer 510, the conductive feature 514, the air gap 512, and the barrier layer 508 of the semiconductor device structure 600 may be similar to those of the semiconductor substrate 204, the device layer 206, the first dielectric layer 510, the conductive feature 514, the air gap 512, and the barrier layer 508 of the semiconductor device structure 500.

As shown in FIG. 19, the metal liner layer 318 may be selectively formed on top surfaces of the conductive feature 514. In some embodiments, the metal liner layer 318 may include SiNx or other suitable materials. In some embodiments, the materials and the manufacturing processes of the metal liner layer 318 of the semiconductor device structure 600 may be similar to those of the metal liner layer 318 of the semiconductor device structure 300.

As shown in FIG. 20, the second dielectric layer 220 is formed over the first dielectric layer 510, the conductive feature 514, and the metal liner layer 318. Then, the via structure 224 and the contact structure 225 may be formed in the second dielectric layer 220 in contact with the conductive feature 514. In some embodiments, the materials and the manufacturing processes of the second dielectric layer 220, the barrier layer 226, the via structure 224, and the contact structure 225 of the semiconductor device structure 600 may be similar to those of the second dielectric layer 220, the barrier layer 226, the via structure 224, and the contact structure 225 of the semiconductor device structure 500.

As shown in FIG. 20, the bottom portion of the via structure 224 formed in the metal liner layer 318 may have a width larger than the upper portion of the via structure 224 formed in the second dielectric layer 220. In other words, the bottom portion of the via structure 224, which is in direct contact with the conductive feature 514, includes an extended portion protruding along the x-direction perpendicular to an extension direction (the z-direction) of the via structure 224.

Figure 21:
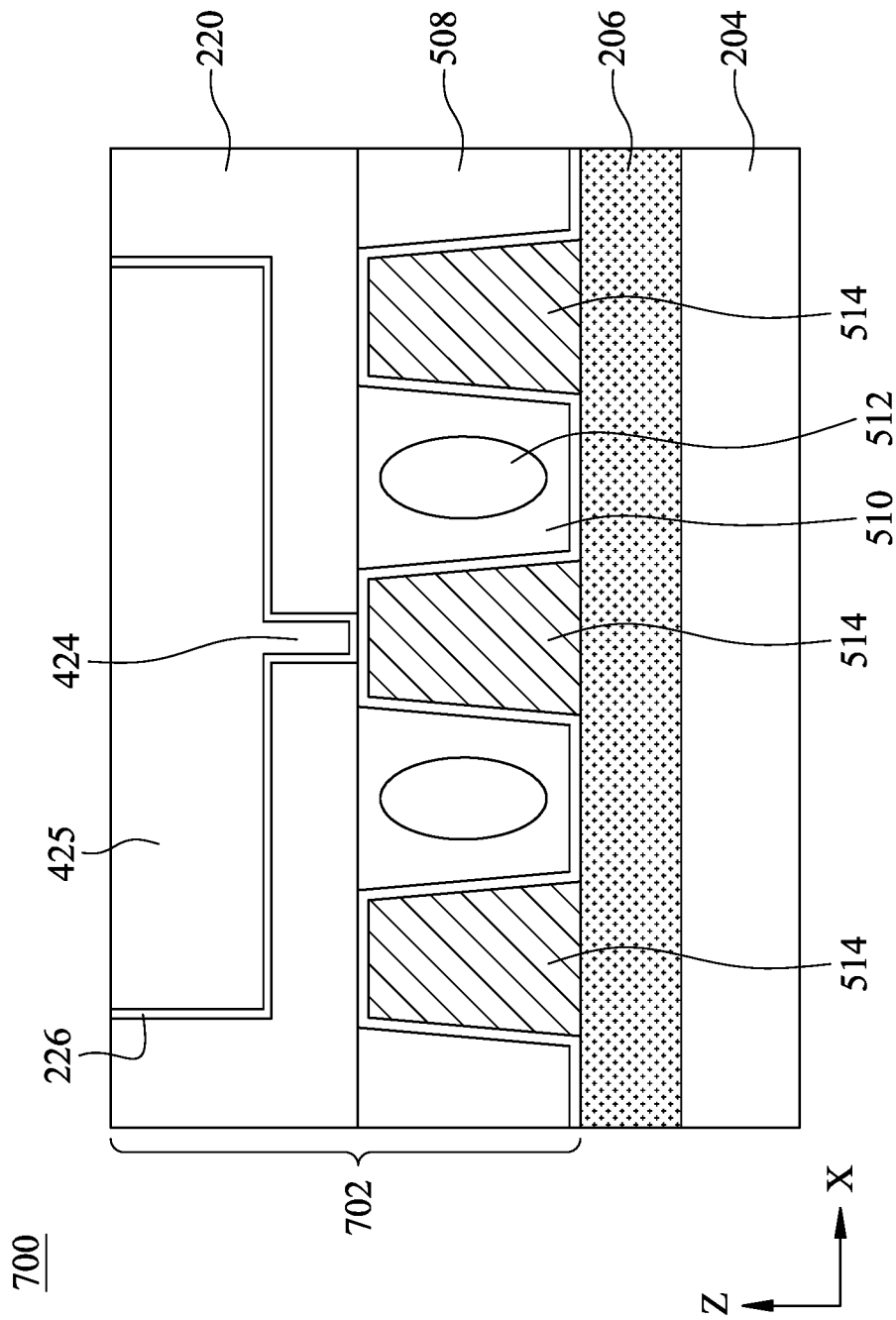
FIG. 21 is a cross-sectional side view of still a further semiconductor device structure, in accordance with some embodiments.

FIG. 21 is a cross-sectional side view of a semiconductor device structure 700, including an interconnection structure 702, in accordance with some embodiments. In some embodiments, the materials and the manufacturing processes of the semiconductor substrate 204, the device layer 206, the first dielectric layer 510, the conductive feature 514, the air gap 512, and the barrier layer 508 of the semiconductor device structure 700 may be similar to those of the semiconductor substrate 204, the device layer 206, the first dielectric layer 510, the conductive feature 514, the air gap 512, and the barrier layer 508 of the semiconductor device structure 500 or 600.

After forming the first dielectric layer 510 in two adjacent conductive features 514, the semiconductor device structure 700 does not include a cap layer or a metal liner layer on the conductive feature 514. In some embodiments, the second dielectric layer 220 is formed over the first dielectric layer 510 and the conductive feature 514.

Then, the via structure 424 and the contact structure 425 may be formed in the second dielectric layer 220 in contact with the conductive feature 514. In some embodiments, the materials and the manufacturing processes of the via structure 424 and the contact structure 425 of the semiconductor device structure 700 may be similar to those of the via structure 424 and the contact structure 425 of the semiconductor device structure 400.

Because the first dielectric layer 510 has a hardness higher than 10 GPa, and the high mechanical strength is advantageous in cases where misalignment occurs. For example, in some embodiments, when the opening for forming the via structure 424 is misaligned with the conductive feature 514, because of the material of first dielectric layer 510 has a hardness higher than 10 GPa that has high mechanical strength, the etch operation for forming the opening will not damage or hardly damage the first dielectric layer 510.

Figure 22:
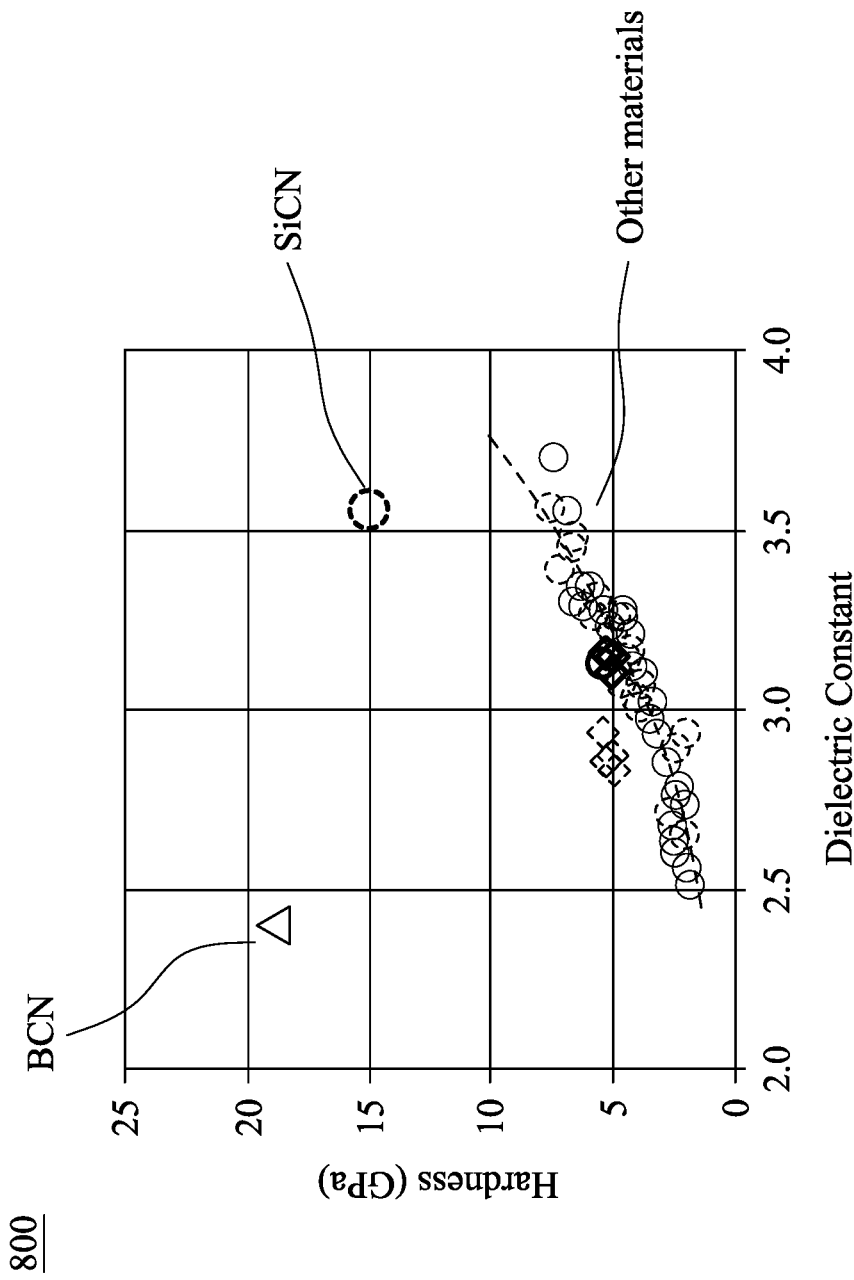
FIG. 22 is a diagram showing the hardness and the dielectric constant of various materials.

FIG. 22 is a diagram 800 showing the hardness and the dielectric constant of various materials. As shown in FIG. 22, when the first dielectric layer 210 or 510 is formed by one of the SiCN based materials described above, the SiCN based material has a hardness near 15 GPa and a k-value near 3.6. When the first dielectric layer 210 or 510 is formed by one of the BCN based materials described above, the BCN based material has a hardness near 19 GPa and a k-value near 2.4. Comparing to other dielectric materials, which have hardness below 10 GPa, the first dielectric layer

210 or 510 has a hardness higher than 10 GPa and a dielectric constant (k-value) in a range between 1.0 and 4.0. The high mechanical strength of the first dielectric layer 210 or 510 can prevent the first dielectric layer 210 or 510 from various etch damages during the subsequent etch processes. The low k-value of the first dielectric layer 210 or 510 can decrease RC delay and reduce cross-talk between nearby interconnects, thereby improving the reliability and performance of the semiconductor device structure. Furthermore, because the thermal dissipation characteristic is proportional to the root of the mechanical strength, with a high mechanical strength, the first dielectric layer 210 or 510 will also have a high thermal dissipation characteristic and improve the performance of the high-power devices as well.

An embodiment is a method for forming an interconnection structure. A first dielectric layer is formed on a semiconductor structure. The first dielectric layer has a hardness higher than 10 GPa and a dielectric constant in a range between 1.0 and 4.0. A trench is formed in the first dielectric layer along a first direction exposing a portion of the semiconductor structure. A conductive feature is formed in the trench in contact with the semiconductor structure. A second dielectric layer is formed over the first dielectric layer and the conductive feature. A via structure is formed in the second dielectric layer in contact with the conductive feature.

Another embodiment is a method for forming an interconnection structure. A conductive layer is formed on a semiconductor structure. The conductive layer is patterned to form a plurality of conductive features on the semiconductor structure. A first dielectric layer is formed between two adjacent conductive features of the plurality of conductive features. The first dielectric layer has a hardness higher than 10 GPa and a dielectric constant in a range between 1.0 and 4.0. A cap layer is formed on the plurality of conductive features. A second dielectric layer is formed over the cap layer, the first dielectric layer and the plurality of conductive features. The first dielectric layer and the second dielectric layer include different materials. A via structure is formed in the second dielectric layer in contact with the conductive feature.

A further embodiment is an interconnection structure. The interconnection structure includes a first dielectric layer with a hardness higher than 10 GPa and a dielectric constant in a range between 1.0 and 4.0, a first conductive feature disposed in the first dielectric layer, a second dielectric layer disposed over the first dielectric layer and the first conductive feature, and a via structure disposed in the second dielectric layer in contact with the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an interconnection structure, comprising:
   forming a conductive layer on a semiconductor structure;
   patterning the conductive layer to form a plurality of conductive features on the semiconductor structure;
   forming a first dielectric layer between two adjacent conductive features of the plurality of conductive features, wherein the first dielectric layer comprises a silicon oxide carbide (SiOC) based material with ordered structure formed from tetraethyl orthosilicate (TEOS) in an acidic ethanol with a surfactant, and the first dielectric layer has a hardness higher than 10 GPa and a dielectric constant in a range between 1.0 and 4.0;
   forming a cap layer on the plurality of conductive features;
   forming a second dielectric layer over the cap layer, the first dielectric layer and the plurality of conductive features, wherein the first dielectric layer and the second dielectric layer comprise different materials; and
   forming a via structure in the second dielectric layer in contact with the conductive feature.

2. The method of claim 1, wherein forming the first dielectric layer between two adjacent conductive features of the plurality of conductive features, further comprises:
   forming the first dielectric layer having an air gap between two adjacent conductive features of the plurality of conductive features.

3. The method of claim 2, wherein forming the first dielectric layer having the air gap between two adjacent conductive features of the plurality of conductive features, further comprises:
   filling a flowable dielectric material between two adjacent conductive features to generate the air gap within the flowable dielectric material.

4. The method of claim 2, wherein forming the cap layer on the plurality of conductive features, further comprises:
   selectively depositing the cap layer on the plurality of conductive features without covering the first dielectric layer.

5. The method of claim 1, wherein the first dielectric layer comprises a silicon carbo-nitride (SiCN) based material formed from $Si(CH_3)_4$ with $NH_3$ at a deposition temperature between 150 degrees Celsius and 425 degrees Celsius, or from $SiH_4$ with $NH_3$ and $C_2H_4$ at a deposition temperature between 150 degrees Celsius and 425 degrees Celsius.

6. The method of claim 1, wherein the first dielectric layer comprises a boron carbo-nitride (BCN) based material formed from triethyl borate (TEB) with $NH_3$ at a deposition temperature between 150 degrees Celsius and 425 degrees Celsius.

7. A method for forming an interconnection structure, comprising:
   forming a device layer over a substrate;
   forming a conductive layer on the device layer;
   forming openings in the conductive layer, each opening exposing a portion of the device layer;
   forming a first dielectric layer in the openings, wherein the first dielectric layer has a hardness higher than 10 GPa;
   selectively forming a cap layer on the conductive layer, wherein the cap layer is a two-dimensional (2D) material;
   forming a second dielectric layer on the cap layer and the first dielectric layer;
   forming a trench opening in the second dielectric layer; and
   forming a via opening through the second dielectric layer and the cap layer to expose a portion of the conductive layer, wherein the via opening in the cap layer has an extended portion protruding along a horizontal direction perpendicular to a longitudinal direction of the via opening.

8. The method of claim 7, wherein the first dielectric layer has a dielectric constant in a range between 1.0 and 4.0.

9. The method of claim 7, wherein the first dielectric layer and the second dielectric layer comprise a material chemically different from each other.

10. The method of claim 7, wherein the first dielectric layer is formed with an air gap therein.

11. The method of claim 10, further comprising:
after forming openings in the conductive layer, forming a barrier layer between the conductive layer and the first dielectric layer.

12. The method of claim 11, wherein the cap layer is in contact with the barrier layer.

13. The method of claim 7, wherein the first dielectric layer is a silicon carbo-nitride (SiCN) based material or a boron carbo-nitride (BCN) based material.

14. The method of claim 7, wherein the first dielectric layer is a silicon oxide carbide (SiOC) based material with ordered structure.

15. The method of claim 7, wherein the 2D material is graphene.

16. The method of claim 7, further comprising:
subjecting a top surface of the conductive layer to a plasma formed from a hydrogen-based gas, an ammonia-based gas or an argon-based gas.

17. A method for forming an interconnection structure, comprising:
forming a conductive layer over a semiconductor structure;
patterning the conductive layer to form a plurality of conductive features;
forming a first dielectric layer between two adjacent conductive features, wherein the first dielectric layer comprises a silicon oxide carbide (SiOC) based material with ordered structure formed from tetraethyl orthosilicate (TEOS) in an acidic ethanol, and the first dielectric layer has a hardness higher than 10 GPa and a dielectric constant in a range between 1.0 and 4.0;
forming a cap layer over the first dielectric layer and the plurality of conductive features;
forming a second dielectric layer on the cap layer; and
forming a via opening and a trench opening in the second dielectric layer.

18. The method of claim 17, wherein the via opening is extended through the second dielectric layer and the cap layer, and a portion of the via opening in the second dielectric layer has a first width and a portion of the via opening in the cap layer has a second width different than the first width.

19. The method of claim 17, wherein the first dielectric layer is formed with an air gap therein.

* * * * *